United States Patent
Yuan et al.

(10) Patent No.: US 10,539,770 B2
(45) Date of Patent: Jan. 21, 2020

(54) MAGNIFICATION COMPENSATION AND/OR BEAM STEERING IN OPTICAL SYSTEMS

(71) Applicant: SUSS MicroTec Photonic Systems Inc., Corona, CA (US)

(72) Inventors: Yanrong Yuan, Irvine, CA (US); John Bjorkman, Costa Mesa, CA (US); Paul Ferrari, Mission Viejo, CA (US); Jeff Hansen, Corona, CA (US)

(73) Assignee: SUSS MICROTEC PHOTONIC SYSTEMS INC., Corona, CA (US)

( * ) Notice: Subject to any disclaimer, the term of this patent is extended or adjusted under 35 U.S.C. 154(b) by 0 days.

(21) Appl. No.: 16/011,564

(22) Filed: Jun. 18, 2018

(65) Prior Publication Data
US 2018/0364463 A1     Dec. 20, 2018

Related U.S. Application Data

(60) Provisional application No. 62/522,062, filed on Jun. 19, 2017.

(51) Int. Cl.
*G02B 17/08*     (2006.01)
*G02B 7/09*      (2006.01)
(Continued)

(52) U.S. Cl.
CPC ........... *G02B 17/0896* (2013.01); *G02B 7/09* (2013.01); *G02B 7/102* (2013.01); *G02B 17/008* (2013.01);
(Continued)

(58) Field of Classification Search
CPC .... G03B 21/28; G03B 21/142; G03B 21/147; G03B 21/145; G03B 21/10; G03B 21/00; G03F 7/702; G03F 7/70233; G03F 7/70825; G03F 7/20; G03F 7/7025; G03F 7/70258; G03F 7/70275; G02B 17/08; G02B 5/09;
(Continued)

(56) References Cited

U.S. PATENT DOCUMENTS

| 5,557,469 A | 9/1996 | Markle et al. |
| 2006/0001855 A1 | 1/2006 | Lof et al. |

(Continued)

FOREIGN PATENT DOCUMENTS

| EP | 0815480 | 1/1998 |
| WO | WO 2016/066076 | 5/2016 |

*Primary Examiner* — Mesfin T Asfaw
(74) *Attorney, Agent, or Firm* — Haynes and Boone, LLP

(57) ABSTRACT

Techniques are disclosed for magnification compensation and/or beam steering in optical systems. An optical system may include a lens system to receive first radiation associated with an object and direct second radiation associated with an image of the object toward an image plane. The lens system may include a set of lenses, and an actuator system to selectively adjust the set of lenses to adjust a magnification associated with the image symmetrically along a first and a second direction. The lens system may also include a beam steering lens to direct the first radiation to provide the second radiation. In some examples, the lens system may also include a second set of lenses, where the actuator system may also selectively adjust the second set of lenses to adjust the magnification along the first or the second direction. Related methods are also disclosed.

27 Claims, 15 Drawing Sheets

(51) Int. Cl.
*G02B 17/00* (2006.01)
*G03F 7/20* (2006.01)
*G02B 7/10* (2006.01)
*H01L 21/68* (2006.01)
*G03B 27/42* (2006.01)
*G02B 15/177* (2006.01)
*G02B 13/26* (2006.01)

(52) U.S. Cl.
CPC ..... *G02B 17/0892* (2013.01); *G03F 7/70191* (2013.01); *G03F 7/70225* (2013.01); *G03F 7/70258* (2013.01); *H01L 21/682* (2013.01); *G02B 13/26* (2013.01); *G02B 15/177* (2013.01)

(58) Field of Classification Search
CPC ........ G02B 5/04; G02B 5/10; G02B 27/0043; G02B 27/0983
See application file for complete search history.

(56) References Cited

U.S. PATENT DOCUMENTS

| | | | |
|---|---|---|---|
| 2007/0236676 A1* | 10/2007 | Kato | G03F 7/70216 355/67 |
| 2007/0268474 A1* | 11/2007 | Omura | G02B 13/24 355/67 |
| 2008/0192216 A1 | 8/2008 | Tanaka et al. | |
| 2017/0322493 A1 | 11/2017 | Sun | |

\* cited by examiner

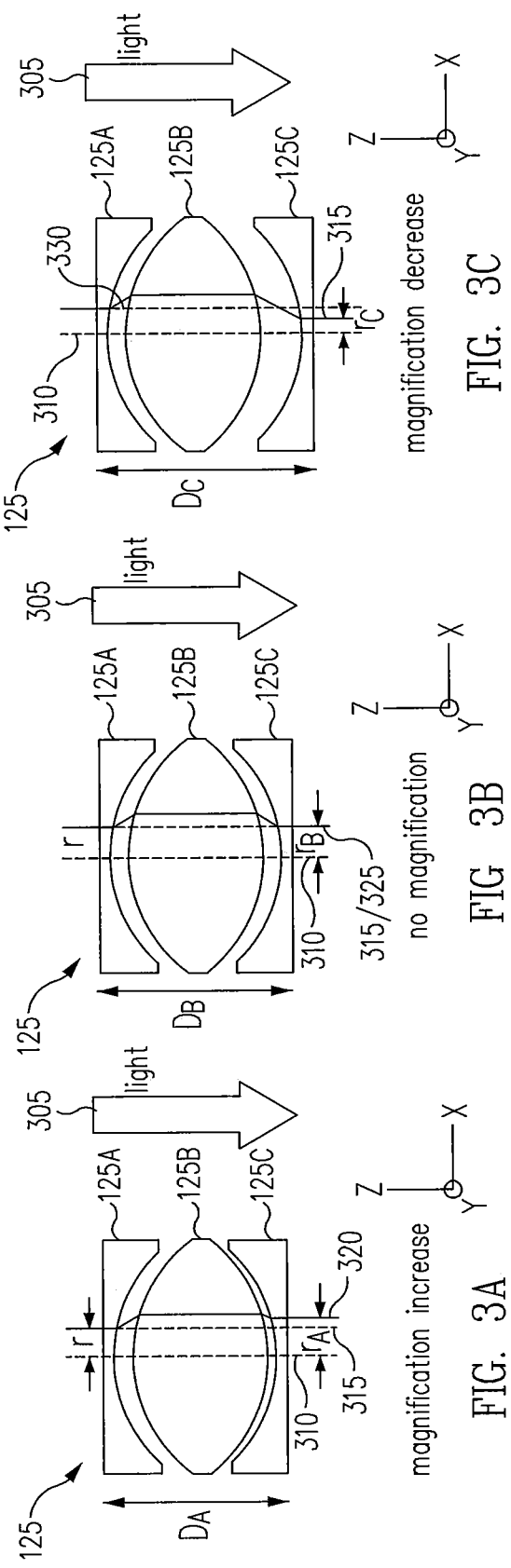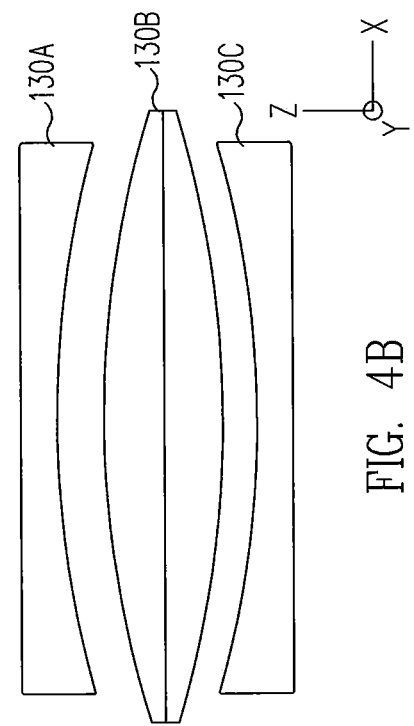

MAGNIFICATION COMPENSATION AND/OR BEAM STEERING IN OPTICAL SYSTEMS

CROSS-REFERENCE TO RELATED APPLICATIONS

This application claims priority to and the benefit of U.S. Provisional Patent Application No. 62/522,062 filed Jun. 19, 2017 and entitled "MAGNIFICATION COMPENSATION AND/OR BEAM STEERING IN OPTICAL SYSTEMS," which is hereby incorporated by reference in its entirety.

TECHNICAL FIELD

One or more embodiments relate generally to optical systems and more particularly, for example, to magnification compensation and beam steering in optical systems.

BACKGROUND

Projection systems are utilized to project an object at an object plane onto an image plane. In semiconductor technology, lithography systems may project a pattern on a mask onto a wafer. In some cases, imperfections may be present between the desired pattern provided by the mask and an actual pattern formed on the wafer. While some imperfections may occur randomly, other imperfections may be due to magnification error. The magnification error may be different in an x-direction and a y-direction and may be attributed to various sources, such as by imperfect placement of die on a wafer by one or more robots, wafer and/or mask expansion (e.g., thermal expansion), settling of compounds used for moulding the die onto the carrier wafer, and/or other sources. Conventional projection systems may attempt to mitigate magnification error by heating and/or cooling the mask or wafer to adjust (e.g., grow or shrink) a target image. However, such heating and/or cooling takes time, which adversely affects throughput, and may be impractical for magnification from wafer to wafer. Additionally, heating and cooling can generally only apply symmetric compensation, and may be limited by the coefficient of thermal expansion of the mask or wafer.

SUMMARY

In one or more embodiments, an optical system includes a lens system configured to receive first radiation associated with an object and direct second radiation associated with an image of the object toward an image plane. The lens system includes a first set of lenses configured to receive and selectively magnify the first radiation. The lens system also includes an actuator system configured to selectively adjust the first set of lenses to adjust a magnification associated with the image symmetrically along a first direction and a second direction. The lens system also includes a beam steering lens configured to direct, based at least on a tilt of the beam steering lens, the first radiation selectively magnified by the first set of lenses to provide the second radiation. The tilt of the beam steering lens may be adjustable by the actuator system. The first direction may be orthogonal to the second direction. In some cases, the image plane may be parallel to an object plane. In other cases, the image plane is not parallel to the object plane.

In one or more aspects, the optical system may also include a lens assembly including a plurality of lenses. The optical system may further include a first prism configured to pass the first radiation to the lens assembly, where the first set of lenses is configured to pass the first radiation to the first prism. The optical system may further include a mirror configured to receive the first radiation from the first prism via the plurality of lenses of the lens assembly and reflect the first radiation. The optical system may further include a second prism configured to receive the first radiation reflected from the mirror via the plurality of lenses of the lens assembly and direct the first radiation on an optical path toward the image plane.

In some embodiments, the optical system may further include a second set of lenses configured to receive and selectively magnify the first radiation. The actuator system may be further configured to selectively adjust the second set of lenses to adjust the magnification along the first direction or the second direction. The beam steering lens may be configured to direct, based at least on the tilt of the beam steering lens, the first radiation selectively magnified by the first set of lenses and second set of lenses to provide the second radiation. The optical system may further include a lens assembly including a plurality of lenses. The optical system may further include a first prism configured to pass the first radiation to the lens assembly. The optical system may further include a mirror configured to receive the first radiation from the first prism via the plurality of lenses of the lens assembly and reflect the first radiation. The optical system may further include a second prism configured to receive the first radiation reflected from the mirror via the plurality of lenses of the lens assembly and direct the first radiation on an optical path toward the image plane. The first set of lenses may be configured to pass the first radiation to the first prism. The second prism may be configured to pass the first radiation to the second set of lenses.

In one or more aspects, the actuator system may be configured to adjust the second set of lenses to apply a first magnification compensation value along the first direction to the magnification and to apply a second magnification compensation value along the second direction to the magnification. The first magnification compensation value may be different from the second magnification compensation value. The actuator system may be configured to move at least one lens of the first set of lenses from a first position to a second position and/or at least one lens of the second set of lenses from a third position to a fourth position to adjust the magnification. In some cases, the second set of lenses is a single lens, where the actuator system may be configured to bend and/or rotate the single lens to adjust the magnification.

In one or more embodiments, the optical system is a lithography system. The object may include a pattern of a mask. The image plane may include a wafer. The image may include a projection of the object on the wafer. The optical system may further include a magnification controller configured to generate one or more control signals associated with an adjustment to the magnification based at least on a position of the mask relative to a position of the wafer. The actuator system may be configured to receive the one or more control signals and cause adjustment of the magnification in response to the one or more control signals. The optical system may further include a wafer positioning controller configured to adjust the position of the wafer relative to the position of the mask to shift a position of the image on the wafer. In some aspects, the lens system may be configured to project a respective portion of the pattern onto a respective portion of the wafer. The actuator system may be further configured to adjust the tilt of the beam steering lens in response to the one or more control signals, with each portion of the wafer being associated with a respective tilt of the beam steering lens.

In one or more embodiments, a method includes receiving first radiation associated with an object. The method further includes directing the first radiation through at least a first set of lenses to obtain selectively magnified first radiation, where, during the directing the first radiation, selectively adjusting the first set of lenses to adjust a magnification associated with an image of the object symmetrically along a first direction and a second direction. The method further includes directing, based at least on a tilt of a beam steering lens, the selectively magnified first radiation to provide second radiation toward an image plane. In some aspects, the first set of lenses may include a plurality of lenses, where selectively adjusting the first set of lenses may include adjusting a distance between at least two of the plurality of lenses. The first direction may be orthogonal to the first direction. In some cases, the image plane may be parallel to an object plane. In other cases, the image plane is not parallel to the object plane.

In one or more aspects, the directing the first radiation may include directing the first radiation through at least the first set of lenses and a second set of lenses to obtain the selectively magnified first radiation, where, during the directing the first radiation, selectively adjusting the second set of lenses to adjust the magnification along the first direction or the second direction. The selectively adjusting the second set of lenses may include selectively adjusting the second set of lenses to apply a first magnification compensation value along the first direction to the magnification and to apply a second magnification compensation value different from the first magnification compensation value along the second direction to the magnification.

In some embodiments, the method is utilized for a lithography system. The object may include a pattern of a mask. The image plane may include a wafer. The image may include a projection of the object on the wafer. The directing the selectively magnified first radiation may include projecting each portion of the pattern onto a respective portion of the wafer. In some aspects, the method may further include generating one or more control signals associated with an adjustment to the magnification based at least on a position of the mask relative to a position of the wafer, where the selectively adjusting the first set of lenses is based on the one or more control signals. The method may further include adjusting a tilt of a beam steering lens in response to the one or more control signals, where each portion of the wafer is associated with a respective tilt of the beam steering lens.

In one or more embodiments, an optical system includes a lens system configured to receive first radiation associated with an object and direct second radiation associated with an image of the object toward an image plane. The lens system includes a first set of lenses configured to receive at and selectively magnify the first radiation. The lens system also includes a second set of lenses configured to receive and selectively magnify the first radiation. The lens system also includes an actuator system configured to selectively adjust the first set of lenses to adjust a magnification associated with the image symmetrically along a first direction and a second direction. The actuator system is also configured to selectively adjust the second set of lenses to adjust the magnification along at least one of the first direction or the second direction. In one or more aspects, the lens system may further include a beam steering lens configured to direct the first radiation based at least on a tilt of the beam steering lens to provide the second radiation. The tilt of the beam steering lens may be adjustable by the actuator system.

In some embodiments, the optical system further includes a lens assembly including a plurality of lenses. The optical system further includes a first prism configured to pass the first radiation to the lens assembly. The optical system further includes a mirror configured to receive the first radiation from the first prism via the plurality of lenses of the lens assembly and reflect the first radiation. The optical system further includes a second prism configured to receive the first radiation reflected from the mirror via the plurality of lenses of the lens assembly and direct the first radiation on an optical path toward the image plane. The first set of lenses may be configured to pass the first radiation to the first prism, and the second prism may be configured to pass the first radiation to the second set of lenses.

In some aspects, the actuator system may be configured to adjust the second set of lenses to apply a first magnification compensation value along the first direction to the magnification and to apply a second magnification compensation value along the second direction to the magnification. The first magnification compensation value may be different from the second magnification compensation value. In some cases, the first direction may be orthogonal to the second direction. In some implementations, the actuator system may be configured to move at least one lens of the first set of lenses from a first position to a second position and/or at least one lens of the second set of lenses from a third position to a fourth position to adjust the magnification.

In some embodiments, the optical system may be a lithography system. The object may include a pattern of a mask. The image plane may include a wafer. The image may include a projection of the object on the wafer. The optical system may include a beam steering lens configured to provide the second radiation based at least on a tilt of the beam steering lens. The lens system may be configured to project a respective portion of the pattern onto a respective portion of the wafer. The actuator system may be further configured to adjust a tilt of the beam steering lens in response to one or more control signals. Each portion of the wafer may be associated with a respective tilt of the beam steering lens.

In one or more embodiments, a method includes receiving radiation associated with an object. The method includes directing the radiation toward an image plane through at least a first set of lenses and a second set of lenses. The method includes, during the directing, selectively adjusting the first set of lenses to adjust a magnification associated with an image of the object symmetrically along a first direction and a second direction; and selectively adjusting the second set of lenses to adjust the magnification along the first direction or second direction.

In some embodiments, such as for lithography systems, the object include a pattern of a mask, the image plane may include a wafer, the image may include a projection of the object on the wafer, and the directing the radiation includes projecting each portion of the pattern onto a respective portion of the wafer. The method may further include generating one or more control signals based at least on a position of the mask relative to a position of the wafer. The method may further include adjusting a tilt of a beam steering lens in response to the one or more control signals. Each portion of the wafer may be associated with a respective tilt of the beam steering lens.

In one or more embodiments, a method includes providing a first set of lenses of a lens system and a second set of lenses of the lens system. The method further includes receiving, by the lens system, first radiation associated with an object. The method further includes directing the first radiation through the first set of lenses to magnify the first radiation symmetrically along a first direction and a second direction orthogonal to the first direction. The method further includes directing the first radiation through the second set of lenses to magnify the first radiation along the first direction or the second direction. The method further includes directing second radiation associated with an image of the object toward an image plane, where the second radiation is based on the first radiation having passed the first and second set of lenses.

The scope of the disclosure is defined by the claims, which are incorporated into this section by reference. A more complete understanding of embodiments of the disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIGS. 3A through 3C illustrate examples of relative positioning of lenses of a symmetric magnification lens set in accordance with one or more embodiments of the present disclosure.

FIG. 4A illustrates an example cross-sectional view of a symmetric magnification lens set in accordance with one or more embodiments of the present disclosure.

FIG. 4B illustrates an example cross-sectional view of an asymmetric magnification lens set in accordance with one or more embodiments of the present disclosure.

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
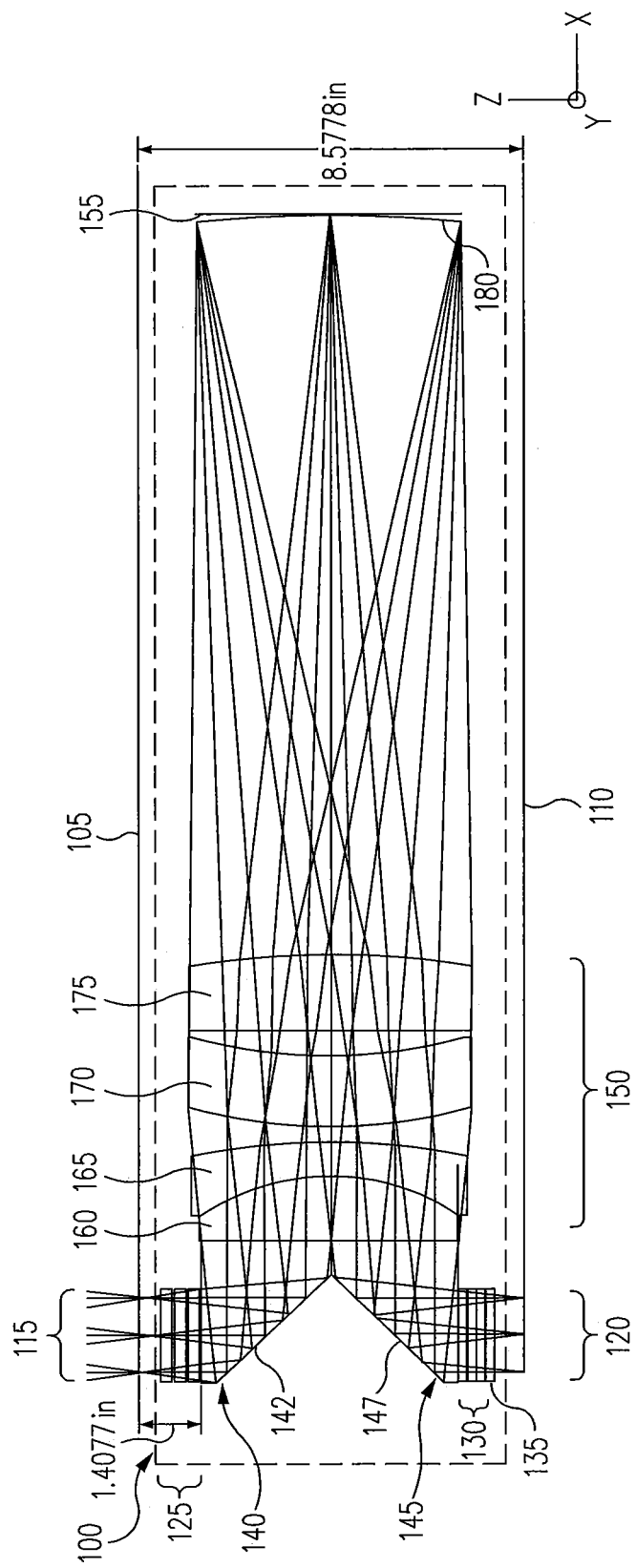
FIG. 1 illustrates an optical system in accordance with one or more embodiments of the present disclosure.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more embodiments. In one or more instances, structures and components are shown in block diagram form in order to avoid obscuring the concepts of the subject technology. One or more embodiments of the subject disclosure are illustrated by and/or described in connection with one or more figures and are set forth in the claims.

Various techniques are provided to facilitate magnification compensation and beam steering in optical systems. The magnification compensation may be utilized to account for magnification error, such as due to imperfect placement of die on a wafer, wafer and/or mask expansion, and/or other situations. In some embodiments, an optical system may include sets of lenses to provide magnification compensation (e.g., also referred to as magnification correction or magnification adjustment). The sets of lenses utilized for magnification compensation may collectively be referred to as magnification compensation lenses. The magnification compensation may be used to adjust (e.g., change, correct, compensate) a nominal magnification of the optical system. In this regard, the nominal magnification of the optical system may refer to a magnification of the optical system without any magnification compensation provided by the magnification compensation lenses. In an aspect, the magnification compensation provided by the magnification compensation lenses may be referred to simply as magnification, since magnification compensation lenses are effectively providing magnification to the object. As used herein, a magnification provided by the magnification compensation lenses may be a positive magnification (e.g., image is made larger relative to a case without the provided magnification), negative magnification (e.g., image is made smaller relative to a case without the provided magnification), or zero magnification (e.g., magnification compensation lenses do not magnify or demagnify). In an aspect, magnification may refer to a ratio of an image size at an image plane (e.g., also referred to as a subject plane) to an object size at an object plane.

A first set of lenses may provide the same magnification compensation along both an x-direction and a y-direction that is orthogonal to the x-direction. Such magnification compensation may be referred to as symmetric magnification compensation or rotation symmetric magnification compensation. The first set of lenses may be referred to as, or may be implemented by, a symmetric magnification lens set. The symmetric magnification lens set may include one or more symmetric lenses, such as one or more spherical lenses. A second set of lenses may provide different magnification compensation along the x-direction and/or y-direction. Such magnification compensation may be referred to as a single axis magnification compensation or asymmetric magnification compensation. The second set of lenses may be referred to as an asymmetric magnification lens set. The asymmetric magnification lens set may include one or more asymmetric lenses, such as one or more cylindrical lenses. Although the optical system described in various embodiments of the present disclosure include one set of lenses for symmetric magnification compensation and another set of lenses for asymmetric magnification compensation, the optical system may include fewer sets of lenses, additional sets of lenses, and/or different combination of sets of lenses to provide symmetric magnification compensation and/or asymmetric magnification compensation in other embodiments. For example, in one embodiment, the optical system may include a single set of lenses for symmetric magnification compensation (e.g., without a set of lenses for asymmetric magnification compensation).

Each set of lenses may include one or more lenses (e.g., one or more convex lenses and/or one or more concave lenses). In an aspect, the first set of lenses may include three lenses (e.g., also referred to as a lens trio). As an example, the three lenses may include two plano-concave lenses and one biconvex lens. As another example, the three lenses may include two plano-convex lenses and one biconcave lens.

The optical system may include an actuator system to facilitate adjustment of the magnification compensation provided by the magnification compensation lenses. As an example, in a case that a set of lenses includes two or more lenses, the magnification compensation provided by this set of lenses may be adjusted by adjusting a size of a gap (e.g., an air gap) between at least two of the lenses in the set. In this regard, the actuator system may move one or more of the lenses in the set to adjust the size of the gap. As another example, in a case that a set of lenses includes a single lens, the magnification compensation provided by the single lens may be adjusted by bending (e.g., deforming) the single lens, such as by applying force using the actuator system.

In one or more embodiments, the optical system may include one or more beam steering elements to direct a beam to an image plane. A beam steering element may be, or may be referred to as, a beam steering lens, beam steering window, tilting lens, tilting window, and/or variants thereof. The beam steering element(s) may receive a beam that has propagated through the first and second sets of lenses.

Using various embodiments, magnification of an optical system, such as a telecentric optical system, may be controlled. In some embodiments, the optical systems may be, may include, or may be a part of, a semiconductor lithography system, such as a Wynn-Dyson 1:1 (e.g., unit magnification) scanning projection system and/or other photolithographic image systems, and/or generally any projection lens system for projecting an image of an object at an object plane onto an image plane. In some aspects, for projection lens systems that are telecentric in object and image, magnification cannot be changed by changing object or image distances. In some cases, large radius convex and concave lenses may be employed in projection lens object telecentric space or image telecentric space to provide magnification compensation. The use of magnification compensation lenses in a projection lens system allows the magnification provided by the optical system to be adjusted. In some cases, the addition of magnification compensation lenses of larger radius into a projection lens system causes smaller impact to image performance (e.g., relative to addition of smaller magnification compensation lenses). Magnification compensation and beam steering may be performed quickly to maintain throughput while reducing magnification error. Furthermore, such techniques allow for asymmetric magnification compensation, in which different magnification compensation is provided for different directions.

Turning now to the figures, FIG. 1 illustrates an optical system 100 in accordance with one or more embodiments of the present disclosure. Not all of the depicted components may be required, however, and one or more embodiments may include additional components not shown in FIG. 1. Variations in the arrangement and type of the components may be made without departing from the spirit or scope of the claims as set forth herein. Additional, fewer, and/or different components may be provided. In an embodiment, the optical system 100 may be utilized to provide optical asymmetric magnification with beam steering.

Various optical components of the optical system 100 reflect and/or refract radiation incident on or propagating through the optical components. In some aspects, the radiation is electromagnetic (EM) radiation. EM radiation may generally refer to any radiation in the EM spectrum and may be referred to as an EM beam of radiation, EM beam, light, beam, or variant thereof (e.g., EM beam of light). The term light may include visible light, infrared light, ultraviolet (UV) light, or generally any portion of the EM spectrum. In some cases, light-transmissive surfaces of various components of the optical system 100 may be coated with material to increase light-transmission therethrough. Alternatively and/or in addition, reflective surfaces of various components of the optical system 100 may be coated to increase reflectivity.

In one embodiment, such as shown in FIG. 1, an object plane 105 is parallel to and spaced from an image plane 110 along a z-direction (e.g., vertical direction in FIG. 1). An example distance between the object plane 105 and the image plane 110 is around 8.58 inches. The object plane 105 and image plane 110 are disposed on opposite sides of the optical system 100. A radiation source (not shown in FIG. 1) may provide a beam 115 (e.g., EM radiation) through the object plane 105 and to the optical system 100. For example, the radiation source may be a light source, such as a UV light source. The beam 115 may propagate through various components of the optical system 100 and be output as a beam 120 to the image plane 110. In this manner, an image of an object at the object plane 105 may be projected onto the image plane 110. In other embodiments, the object and image plane are at a defined angle to one another (e.g., the object and image plane are not parallel to one another).

In an embodiment, for example, when the optical system 100 is provided as part of a lithography system (e.g., a semiconductor lithography system), a reticle, mask, or generally any structure that has a microelectronics pattern defined thereon (e.g., on a plate/film of material) may be provided as an object at the object plane 105 to be projected onto the image plane 110. A wafer on which structures are to be fabricated or manufactured may be provided at the image plane 110 to receive the projection of the microelectronics pattern. In this regard, the beam 115 propagates through the object (e.g., reticle, mask, etc.) at the object plane 105 and is directed by the optical system 100 to the image plane 110. In some cases, the optical system 100 may apply magnification (e.g., positive or negative magnification) to the beam 115. In an aspect, magnification may refer to a ratio of an image size at the image plane 110 to an object size at the object plane 105.

In some embodiments, the optical system 100 includes a symmetric magnification lens set 125, an asymmetric magnification lens set 130, a beam steering lens 135, prisms 140 and 145, a lens assembly 150, and a mirror 155. In some cases, the dashed box in FIG. 1 may represent a housing of the optical system 100. For example, the housing may include a window and/or material that allows the beam 115 to pass into (e.g., couple into) the optical system 100. In some aspects, the asymmetric magnification lens set 130 is optional as described further herein.

The lens assembly 150 includes lenses 160, 165, 170, and 175. The lens 160, 165, 170, and 175 may be a plano-convex lens, concavo-convex lens, convexo-concave lens, and meniscus lens, respectively. In an aspect, the mirror 155 and lenses 160, 165, 170, and 175 are positioned (e.g., mounted) along an optical axis of the optical system 100. An optical axis of the optical system 100 may refer to an axis through which a beam can traverse without being refracted. In an aspect, the lenses 160, 165, 170, and 175 are made of material and/or positioned to collectively correct for chromatic aberrations, field aberrations, and/or astigmatism. The lenses 160, 165, 170, and 175 may be made of the same or different glass types.

The lens 160 has a plane surface facing away from the mirror 155 and a convex surface facing the mirror 155. The convex surface of the lens 160 may face a concave surface of the lens 165. In some cases, the convex surface of the lens 160 may be nested into the concave surface of the lens 165. For example, the lenses 160 and 165 may be cemented together to form a doublet. The lens 165 has a convex surface facing the mirror 155. A curvature of the convex surface of the lens 165 may be less than that of the concave surface of the lens 165 and less than that of the convex surface of the lens 160.

The lens 170 has a convex surface facing away from the mirror 155 and toward the lens 160 and a concave surface facing the mirror 155. The lens 175 has a convex surface facing the mirror 155 and a concave surface facing away from the mirror 155 and toward the lens 160. In some cases, the curvatures of the surfaces of the lens 175 are less than those of the lens 165 and those of the lens 170.

The mirror 155 has a concave surface 180 centered on an optical axis of the optical system 100 and facing the lens 160. The concave surface 180 may be spherical or slightly aspherical (e.g., also referred to as substantially spherical). The concave surface 180 may be slightly spherical (e.g., slightly ellipsoidal) to help correct high-order chromatic aberrations for a large field. In an aspect, the shape of the concave surface 180 and the lenses 160, 165, 170, and 175 of the lens assembly 150 and positioning/arrangement thereof may facilitate correction of chromatic aberrations. It is noted that the foregoing provides example characteristics of the lenses 160, 165, 170, and 175. Other combinations of lenses and/or lens characteristics may be utilized. In an embodiment, the lenses 160, 165, 170, and 175 can be either spherical or aspherical. Other embodiments of the Dyson lens are known to those skilled in the art and can be used with the defined magnification and beam steering described in the present disclosure.

The prism 140 (e.g., also referred to as a roof prism) and the prism 145 (e.g., also referred to as a fold prism) are between the object plane 105 and the image plane 110. An example distance between the object plane and a top surface of the prism 140 is around 1.41 inches. In some cases, as shown in FIG. 1, the prisms 140 and 145 are mounted adjacent to each other and to the lens 160. In this regard, the prisms 140 and 145 are adjacent to a side of the lens 160 that is farther from the mirror 155. The prisms 140 and 145 each have a planar face that is adjacent to a planar face of the lens 160. This planar face of the prisms 140 and 145 lies in a plane perpendicular to the object plane 105, image plane 110, and an optical axis of the lens assembly 150 and mirror 155.

The prism 140 has an apex edge 142 that extends toward the object plane 105 at a 45° angle to the object plane 105 and 45° angle to the planar surface of the lens 160. The prism 140 has roof surfaces that are planar and extend to the apex edge 142. The roof surfaces may be at a 90° angle of each other. The prism 145 has a planar face parallel to and facing the object plane 105. The prism 145 has a face 147 lying at a 45° angle to the object plane 105 and image plane 110. The face 147 is perpendicular to a plane that contains the apex edge 142 of the prism 140 and to the object plane 105 and image plane 110. The face 147 and the apex edge 142 of the prism 140 are convergent, relative to each other, in a direction toward the mirror 155. The prisms 140 and 145 are contiguous to each other generally in a plane that is around halfway between and parallel to the object plane 105 and image plane 110. In some cases, such as shown in FIG. 1, the prisms 140 and 145 have a flat surface that are contiguous to each other at this halfway point.

The prisms 140 and 145 and the lenses 160, 165, 170, and 175 are appropriately sized (e.g., sufficiently large) to receive and pass a particular field size and shape to be projected from the object plane 105 to the image plane 110. The symmetric magnification lens set 125 and asymmetric magnification lens set 130 may be utilized to provide a particular field size and shape. In FIG. 1, the symmetric magnification lens set 125 is positioned between the object plane 105 and the prism 140, and the asymmetric magnification lens set 130 is positioned between the prism 145 and the image plane 110. The symmetric magnification lens set 125 may magnify the beam 115 received from the object plane 105. The asymmetric magnification lens set 130 may magnify a beam passed through the prism 145 to provide the beam 120 to the image plane 110. In aspects where the asymmetric magnification lens set 130 is not provided in the optical system 100, the prism 145 may provide the beam 120 to the image plane 110. For example, in an embodiment without the asymmetric magnification lens set 130, remaining components of FIG. 1 may remain as shown in FIG. 1, except with a surface of the prism 145 facing a surface of the beam steering lens 135 and the prism 145 providing the beam 120 to the image plane 110 via the beam steering lens 135.

The symmetric magnification lens set 125 provides symmetric magnification compensation along the x- and y-directions. The symmetric magnification lens set 125 includes lenses 125A-C. The lenses 125A-C may be, or may collectively provide, one or more spherical lenses. In one example, the lenses 125A, 125B, and 125C may be a plano-concave lens, biconvex lens, and concave-plano lens, respectively. In another example, the lenses 125A, 125B, and 125C may be a plan-convex lens, biconcave lens, and convex-plano lens. In an aspect, at least one of the lenses 125A-C may be moveable (e.g., via translational motion) by an actuator system (not shown in FIG. 1) associated with the optical system 100 to adjust the symmetric magnification compensation provided by the symmetric magnification lens set 125. For example, the actuator system may be provided as part of or otherwise coupled to the optical system 100. In some cases, one or two of the lenses 125A-C are movable whereas the remaining of the lenses 125A-C are intended to remain fixed in position. In a further embodiment, all the lenses 125A-C are moveable.

The asymmetric magnification lens set 130 provides magnification compensation adjustment along one or both of the x- or y-direction. The asymmetric magnification lens set 130 includes lenses 130A-C. The lenses 130A-C may be, or may collectively provide, one or more cylindrical lenses. In one example, the lenses 130A, 130B, and 130C may be a plano-convex lens, concave-concave lens, and a convex-plano lens. In another example, the lenses 130A-C may be a plano-concave lens, biconvex lens, and concave-plano lens, respectively. A thickest portion of the lenses 130A-C may be around 2 mm to 10 mm. In one example, the lenses 130A-C may be made using circular, square, or rectangular glass. In some cases, a rectangular external shape may be easier for production and alignment. In an aspect, at least one of the lenses 130A-C may be moveable (e.g., via translational motion) by the actuator system associated with the optical system 100 to adjust the asymmetric magnification compensation provided by the asymmetric magnification lens set 130. In some cases, one or two of the lenses 125A-C are movable whereas the remaining of the lenses 130A-C are intended to remain fixed in position. In a further embodiment, all the lenses 130A-C are moveable.

In an aspect, the asymmetric magnification compensation range provided by the asymmetric magnification lens set 130 may be smaller (e.g., may be designed to be smaller) than the symmetric magnification compensation range provided by the symmetric magnification lens set 125, since larger asymmetric magnification compensation may affect system astigmatism. As an example, the symmetric magnification lens set 125 may be utilized to provide a symmetric magnification compensation range of −250 parts per million (ppm) to +250 ppm along both the x- and y-directions, whereas the asymmetric magnification lens set 130 may be utilized to provide magnification compensation range of −50 ppm to +50 ppm along one or both of the x- or y-directions. In an aspect, a positive magnification compensation provides an increase in magnification (e.g., relative to a case without the magnification compensation lenses), a negative magnification compensation provides a decrease in magnification, and zero magnification compensation maintains the magnification. In this example, the optical system 100 may provide a compensation range of about ±250 ppm symmetric compensation and single-axis compensation range of about ±50 ppm.

In an aspect, the symmetric magnification lens set 125 may be, or may be considered to be, two pairs of lenses. For example, a size of a gap (e.g., an air gap) between a first pair of lenses may provide magnification compensation range of 0 to +250 ppm, and a size of a gap between a second pair of lenses may provide magnification compensation range of −250 ppm to 0. In this regard, the first pair of lenses may include the lenses 125A and 125B, and the second pair of lenses may include the lenses 125B and 125C.

Optionally, a beam steering lens 135 may receive an output of the asymmetric magnification lens set 130 and direct the beam 120 to the image plane 110. In some cases, the beam steering lens 135 may have an adjustable tilt to direct the beam 120 along the x and/or y-directions (e.g., relative to a case without the beam steering lens 135). In aspects where the asymmetric magnification lens set 130 is not provided in the optical system 100, the prism 145 may provide the beam 120 to the beam steering lens 135 and the beam steering lens 135 may direct the beam 120 to the image plane 110.

An optical path of the optical system 100 is a path that the beam 115 provided from the object plane 105 takes in traversing through the optical system 100 to be provided as the output beam 120 to be directed onto the image plane 110. It is noted that an intensity of the beam 115 may be attenuated, such as by absorption and/or scattering losses, as the beam 115 traverses through the optical path, through various components (e.g., lenses, mirrors) along the optical path, and/or impinges on mirror surfaces.

In traversing through an optical path of the optical system 100, the beam 115 passes an object at the object plane 105 and enters the optical system 100. After entering the optical system 100, the beam 115 passes through the symmetric magnification lens set 125. The symmetric magnification lens set 125 may apply symmetric magnification compensation to the beam 115. A resulting beam exits the symmetric magnification lens set 125, passes through the prism 140, and is reflected by the prism 140, such as by the apex edge 142, in different directions. The beam reflected by the prism 140 passes through, in order, the lenses 160, 165, 170, and 175 and strikes different portions of the concave surface 180 of the mirror 155. The concave surface 180 of the mirror 155 reflects the incident beam. The beam reflected by the concave surface 180 passes through, in order, the lenses 175, 170, 165, and 160 and to the prism 145, following which the prism 145 directs the beam toward the asymmetric magnification lens set 130. The asymmetric magnification lens set 130 may apply asymmetric magnification compensation to the beam. A resulting beam may be provided to the beam steering lens 135 to be directed by the beam steering lens 135 to the image plane 110. An output of the beam steering lens 135 is the beam 120, which may be considered an output beam of the optical system 100.

It is noted that FIG. 1 illustrates an example combination of the prisms 140 and 145, lenses 160, 165, 170, and 175 of the lens assembly 150, and mirror 155 and arrangement thereof (e.g., relative to the object plane 105 and image plane 110). In some cases, fewer, more, and/or different components may be employed in the optical system 100. As one example, although the symmetric magnification lens set 125 and the asymmetric magnification lens set 130 are each depicted as having three lenses, the symmetric magnification lens set 125 and the asymmetric magnification lens set 130 may each have a different number of lenses than the three lenses depicted in FIG. 1, such as one lens, two lens, or more than three lenses. The symmetric magnification lens set 125 may have a different number of lenses than the asymmetric magnification lens set 130. As another example, in some cases, the beam steering lens 135 is not employed in the optical system 100. As another example, one or more of the lenses 160, 165, 170, and 175 of the lens assembly 150 is not employed in the optical system 100.

Other combinations of components and/or arrangements thereof may be employed in an optical system. As one variation, the positions of the prisms 140 and 145 can be reversed without affecting operation of the prisms 140 and 145. As another variation, the symmetric magnification lens set 125 and/or asymmetric magnification lens set 130 may be provided at different locations than that shown in FIG. 1. For example, in one embodiment, the symmetric magnification lens set 125 may be placed between the prism 140 and the lens 160. In another example, the lens sets 125 and 130 may be placed between the lens 160 and either or both the prisms 140 and 145. In another example, the lens sets 125 and 130 may be reversed in position from that shown in FIG. 1, or generally reversed in position such that the lens set 130 is placed at an earlier point in the optical path than the lens set 125. In one variation of this example, the asymmetric magnification lens set 130 may be placed above the prism 140 and the symmetric magnification lens set 125 may be placed below the prism 145. In other words, the asymmetric magnification lens set 130 is at an earlier point in the optical path than the prism 140, and the symmetric magnification lens set 125 is at a later point in the optical path than the prism 145. In another configuration, the lens set 125 and 130 can be combined into a single set of lenses and placed in any of the previously defined locations. Various combinations of these examples and/or other arrangements may be utilized in placing the lens sets 125 and/or 130 relative to the prisms 140 and 145 and lens 160. Additional examples of combinations of components and/or arrangements thereof are provided in U.S. Pat. No. 5,559,629, which is incorporated herein by reference in its entirety.

Although the optical system 100 of FIG. 1 illustrates an example in which the object plane 105 is parallel to the image plane 110, in another embodiment (not shown), the object plane 105 and image plane 110 are not parallel to each other. In such an embodiment, the face of the prism 140 closest to the object plane 105 is parallel to the object plane 105 and the face of the prism 145 closest to the image plane 110 is parallel to the image plane 110. The faces of the prism 140 and 145 closest to the lens 160 are parallel. In such an embodiment, for example, the prisms 140 and 145 can both be internally reflecting fold prisms.

Figure 2A:
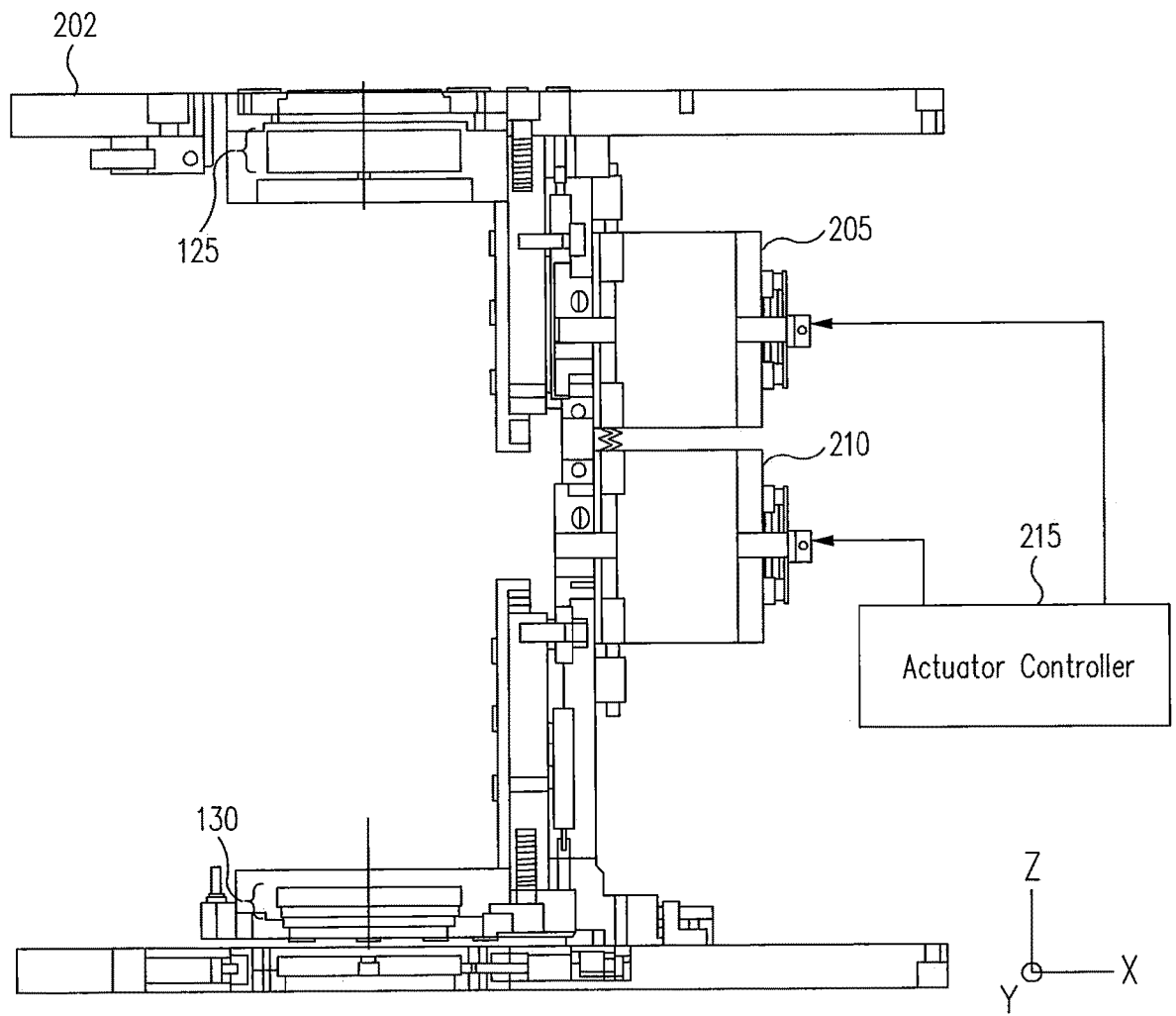
FIGS. 2A and 2B illustrate a symmetric magnification lens set, an asymmetric magnification lens set, and an associated mounting system and actuator system in accordance with one or more embodiments of the present disclosure.
Figure 2B:
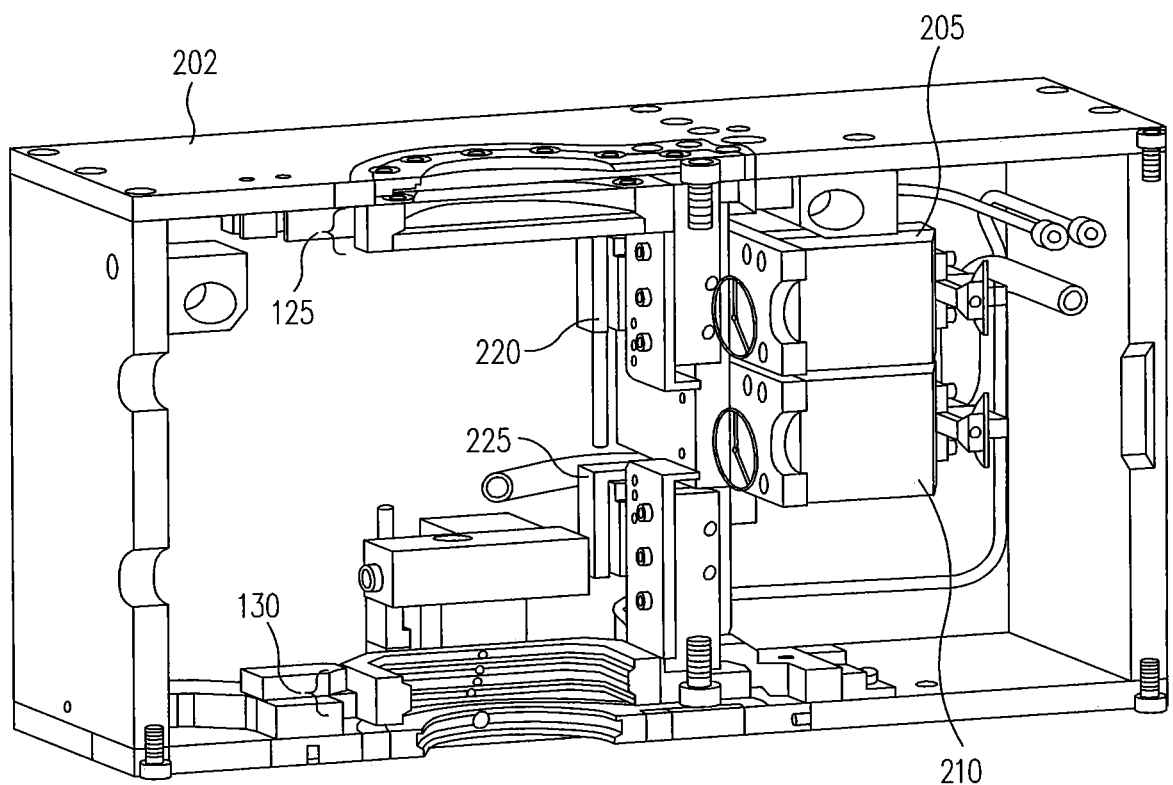

FIGS. 2A and 2B illustrate views of the symmetric magnification lens set 125 and asymmetric magnification lens set 130 of the optical system 100 and an associated mounting system and actuator system in accordance with one or more embodiments of the present disclosure. Not all of the depicted components may be required, however, and one or more embodiments may include additional components not shown in FIGS. 2A and 2B. Variations in the arrangement and type of the components may be made without departing from the spirit or scope of the claims as set forth herein. Additional, fewer, and/or different components may be provided. For explanatory purposes, other components of the optical system 100, such as the prisms 140 and 145 and lenses 160, 165, 170, and 175, are not shown in FIGS. 2A and 2B. As shown in FIGS. 2A and 2B, the optical system 100 may include a housing 202 (e.g., also referred to as an enclosure) within which the various components shown in FIG. 1 and associated mounting system and actuator system are disposed.

The mounting system may include structural features/components (e.g., screws, adhesive, clamps, receiving interfaces, etc.) that help support (e.g., hold in place) the lens sets 125 and 130 (and possibly other components of the optical system 100). The actuator system may include an actuator 205, an actuator 210, an actuator controller 215, a feedback device 220, and a feedback device 225. The actuator 205 may be configured to move one or more lenses of the symmetric magnification lens set 125. For example, one, two, or all three lenses of the symmetric lens set 125 may be movable by the actuator 205, while remaining lenses (if any) of the symmetric lens set 125 remain fixed in position. Similarly, the actuator 210 may be configured to move one or more lenses of the asymmetric lens set 130. The actuator controller 215 may receive information and generate control signals for the actuators 205 and 210 based on the received information. The feedback devices 220 and 225 may each be, may each include, or may each be a part of, an encoder; capacitive, inductive or laser sensor; strain gauge; and/or generally any device that can be used to verify a position of the lenses 125A-C and 130A-C, respectively, before, during, and after motion. In this regard, the actuator controller 215 and feedback devices 220 and 225 may operate in tandem (e.g., exchange appropriate information) to help ensure the lenses 125A-C and 130A-C are at appropriate positions before, during, and after motion of one or more of the lenses 125A-C and one or more of the lenses 130A-C.

In an embodiment, the actuator controller 215 may receive information associated with a relative positioning of a mask and a wafer. In a lithography system, images of the mask and wafer may be captured by camera systems to determine an expected projection of the mask (e.g., pattern of the mask) onto the wafer. The expected projection may be used to determine magnification compensation and/or beam steering needed to adjust from the expected projection to a desired projection. For example, if the image of the wafer targets taken at one or more locations on the wafer is further out from the center of the wafer than the mask targets, then the wafer is determined to have positive magnification and appropriately positive magnification and steering could be applied. If the image of the wafer targets is closer to the center of the wafer than the mask targets, then the wafer is determined to have negative magnification and appropriately negative magnification and steering could be applied. It should be noted that the above example is defined as a case where the mask has no magnification bias. In the case where the mask has a magnification bias, then the appropriate calculations can be applied to provide the desired magnification. In general, it is desirable that the printed mask image matches the magnification of the exiting wafer image (known as zero magnification or zero mag) such that newly printed features properly overlay onto previously printed features across all elements of a wafer. In this regard, using various embodiments, it is possible to print zero magnification, positive magnification, or negative magnification as desired. In addition, offsets in position of wafer targets relative to mask targets may be corrected using beam steering.

In some aspects, multiple points are inspected on the wafer relative to the mask to determine the appropriate alignment. In some cases, for symmetric magnification compensation, a minimum of two points are needed to determine if symmetric magnification compensation should be utilized, and for asymmetric magnification compensation, at least three points may be needed, and preferably four points are inspected, to determine if asymmetric magnification compensation should be utilized. However, more points on the wafer can be inspected to give an overall better alignment and magnification performance.

An additional use of beam steering or micro wafer positioning can be used to compensate for small translational and/or rotational differences between the mask and wafer that are identified during the alignment routine. For example, if the wafer is translated relative to the mask, the wafer can be repositioned to be directly under the mask, or the beam steering can be utilized to compensate for the offset. Such repositioning and/or beam steering may be applied to rotational differences as well. It can also be applied in cases where there is a different correction required in x-direction versus the y-direction for the alignment.

In some cases, the control signals may indicate magnification compensation to be provided by the lens set 125 and/or 130. In these cases, the actuator 205 and 210 may determine (e.g., using a processor) a distance to move one or more of the moveable lens or lenses to effectuate the magnification compensation indicated in the control signals and move the appropriate lens or lenses by the determined distance. In other cases, alternatively and/or in combination, the control signals may directly indicate to the actuators 205 and/or 210 a distance to move one or more of the moveable lens or lenses of their respective lens set.

As discussed previously, a change in magnification of the image projected onto the image plane 110 may be effectuated by adjusting one or both of the symmetric magnification lens set 125 and asymmetric magnification lens set 130. FIGS. 3A through 3C illustrate examples of relative positioning of the lenses 125A-C of the symmetric magnification lens set 125 in accordance with one or more embodiments of the present disclosure. In FIGS. 3A through 3C, the lenses 125A-B remain fixed in position while the lens 125C is moveable along the direction of propagation of light 305 (e.g., the z-direction).

A dashed line 310 in FIGS. 3A-3C depicts an optical path for a portion of the light 305 that passes through an optical axis of the symmetric magnification lens set 125. The lenses 125A-C of the symmetric magnification lens set 125 are positioned such that their respective optical axis overlap. A portion of the light 305 that passes through an optical axis of the symmetric magnification lens set 125 is not refracted (e.g., bent) by the lenses 125A-C. A dashed line 315 in FIGS. 3A-3C is parallel to and displaced by a distance r from an optical axis along the x-direction. A solid line 320, 325, and 330 in FIGS. 3A, 3B, and 3C, respectively, is an optical path of a portion of the light 305 that enters the lens 125A, from the z-direction, at the distance r from the line 310.

To adjust the magnification compensation provided by the symmetric magnification lens set 125, a distance between a topmost surface of the lens 125A and a bottommost surface of the lens 125C (denoted as $D_A$, $D_B$, and $D_C$ in FIGS. 3A, 3B, and 3C, respectively) is adjusted by moving the lens 125C (e.g., by an actuator) along the z-direction while the lenses 125A and 125B are fixed in position. As an example, in FIGS. 3A-3C, $D_A < D_B < D_C$. In other cases, alternatively and/or in addition, the lenses 125A and/or 125B may be moveable to adjust the distance between the topmost surface of the lens 125A and the bottommost surface of the lens 125C. In some cases, a fewer number of moveable lenses may be associated with a reduced number of actuators and/or complexity.

In FIGS. 3A-3C, since only the lens 125C is movable in this example, the different distances $D_A$, $D_B$, and $D_C$ are attributed to a different gap size (e.g., air gap size) between the lenses 125B and 125C. For beams with optical paths away from the optical axis that is denoted by the line 310, the lenses 125A and 125B refracts the beams. In relation to the line 315, the optical path of the beams (shown by the solid lines 320, 325, and 330) deviate from each other during the portion of the optical path after exiting the lens 125B, due to the different gaps between the lenses 125B and 125C to be traversed by the beams. In FIG. 3A, a beam exits the lens 125B and converges toward the line 315, but does not reach the line 315. A distance between the line 310 and the line 320 at an output of the lens 125C is denoted by $r_A$. In this regard, the gap between the lenses 125B and 125C results in $r < r_A$, which indicates that the symmetric magnification lens set 125 increases magnification. An increase in magnification may be referred to as a positive magnification compensation.

In FIG. 3B, a beam exits the lens 125B, converges toward the line 315, and overlaps the line 315. A distance between the line 310 and the line 325 at an output of the lens 125C is denoted by $r_B$. In this regard, the gap between the lenses 125B and 125C results in $r = r_B$, which indicates that the symmetric lens set 125 provides no magnification (e.g., provides zero magnification compensation). In FIG. 3C, a beam exits the lens 125C and converges toward and then passes the line 315. A distance between the line 310 and the line 330 at an output of the lens 125C is denoted by $r_C$. In this regard, the gap between the lenses 125B and 125C results in $r > r_C$, which indicates that the symmetric magnification lens set 125 decreases magnification. A decrease in magnification may be quantified by a negative magnification compensation.

Although the description of FIGS. 3A-3C is with reference to the lenses 125A-C of the symmetric magnification lens set 125, similar description generally applies for the lenses 130A-C of the asymmetric magnification lens set 130.

FIG. 4A illustrates an example cross-sectional view of the lenses 125A-C in accordance with one or more embodiments of the present disclosure. FIG. 4B illustrates an example cross-sectional view of the lenses 130A-C in accordance with one or more embodiments of the present disclosure.

In an embodiment, magnification lens sets (e.g., 125, 130) may be designed such that the magnification lens set can selectively add a controllable amount of power into an optical system (e.g., 100) to change a magnification associated with the optical system, as would be understood by a person of ordinary skill in the art. As an example, for a thin lens group of two lenses, a combination of thin lens power (denoted as $\varphi'_{ab}$) can be calculated as follows:

$$\varphi'_{ab} = \varphi'_a + \varphi'_b - d\varphi'_a\varphi'_b$$

where $\varphi'_a$ is a first lens power, $\varphi'_b$ is a second lens power, and d is a distance between the first and second lenses. If $\varphi'_a = -\varphi'_b$, then $\varphi'_{ab} = d\varphi'^2_a$. Thus, in this case, the thin magnification lens group has zero power when the lens gap (e.g., lens air gap) is zero (i.e., d=0). The power of the magnification lens group increases when the lens gap increases.

Since d is a positive value, this magnification lens group creates positive power. In an aspect, in order for a magnification lens to generate positive or negative magnification correction, another thin lens group with opposite (e.g., and equal) lens power can be employed, so magnification lens group power of the two lens groups is as follows:

$$\varphi'_{ab} = \varphi'_a + \varphi'_b - d_1\varphi'_a\varphi'_b - (\varphi'_a + \varphi'_b - d_2\varphi'_a\varphi'_b)$$

where $d_1$ is a distance between the two lenses of a first thin lens group and $d_2$ is a distance between the two lenses of a second thin lens group. When $d_1 = d_2$, $\varphi'_{ab} = 0$. When $d_1 > d_2$, $\varphi'_{ab} > 0$. When $d_1 < d_2$, $\varphi'_{ab} < 0$. In this case, the magnification lens group has four thin lenses. The four thin lenses may be three lenses if a middle two lenses is combined as a biconvex or biconcave lens. In an embodiment, the magnification lens set 125 and/or 130 may include the first and second thin lens groups as provided above. For example, for the magnification lens set 130, the distance $d_1$ may represent a gap between the lens 130A and 130B, and the distance $d_2$ may represent a gap between the lens 130B and 130C.

In the foregoing, $\varphi'_a = -\varphi'_b$. In other cases, $\varphi'_a \neq -\varphi'_b$ (e.g., first lens power is not equal in magnitude to second lens power). In these cases, when $$d = \frac{\varphi'_a + \varphi'_b}{d\varphi'_a\varphi'_b},$$

$\varphi'_{ab} = 0$. When $$d > \frac{\varphi'_a + \varphi'_b}{d\varphi'_a\varphi'_b}, \varphi'_{ab} < 0.$$

When $$d < \frac{\varphi'_a + \varphi'_b}{d\varphi'_a\varphi'_b}, \varphi'_{ab} > 0.$$

In some cases, a magnification lens set with more lenses may allow a larger magnification correction range (e.g., also referred to as a magnification compensation range). In this regard, three, four, or more lenses may be utilized in a magnification lens set when larger magnification correction range is desired, for example a magnification correction range around or wider than ±250 ppm. For example, the magnification lens set 125 includes the lenses 125A-C and in some cases may provide a magnification correction range of around ±250 ppm. In some cases, two lens in a magnification lens set may be selected when magnification correction is generally within a relatively smaller range, for example a magnification correction range around or under 70 ppm (e.g., between −70 ppm and +70 ppm, between −70 ppm and 0, between 0 and +70 ppm, etc.). For instance, the additional lenses in a four lens group (e.g., relative to a two lens group) may introduce extra distortion into an optical system. Thus, for a smaller desired magnification correction range, fewer lenses may be used such that distortion is smaller.

In an embodiment, the optical system 100 (and/or other optical systems) may be utilized in a stepper lithography tool or a scanner lithography tool. For example, the optical system 100 may be employed on a Dyson lens system that is used in a stepper or a scanner. In an aspect, when used on a stepper, a full field is exposed at one time. In the stepper, the field generally has a rectangular shape. The symmetric magnification lens set 125 and asymmetric magnification lens set 130 may be utilized to adjust a magnification of (e.g., apply magnification compensation to) the field. As the field is stepped over to a next site, the step distance varies to achieve magnification across a wafer. In a stepper tool the field of view (FOV) is smaller than the wafer, so the stepper tool steps the FOV across the wafer. Each step is considered a site. In some cases, when using such magnification adjustment in a stepper tool, the magnification can be set for the average magnification across the whole wafer. In other cases, when using such magnification adjustment in a stepper tool, the magnification setting may be adjusted to an average magnification of the field being exposed, and the magnification setting may be adjusted as the wafer is moved from site to site.

The asymmetric magnification lens set 130 may be utilized to achieve asymmetric magnification. The asymmetric magnification lens set 130 may be oriented to provide magnification compensation along one axis of the scanner's FOV (e.g., magnification compensation in either the x-direction or the y-direction). In an embodiment, the asymmetric magnification lens set 130 is oriented to create an asymmetric magnification normal to a scanning direction. For example, the scanning direction may be the x-direction, and the magnification compensation may be applied in the y-direction.

In operation, the symmetric magnification lens set 125 may provide symmetric magnification compensation in both the x- and y-directions across the scanner's FOV, whereas the asymmetric magnification lens set 130 may provide magnification compensation in the y-direction. An example range of the symmetric magnification compensation may be around ±250 ppm, and an example range of the asymmetric magnification compensation may be around ±50 ppm (e.g., in the y-direction). In this regard, any symmetric magnification compensation between +250 ppm and −250 ppm may be achieved, and any asymmetric magnification compensation between +50 ppm and −50 ppm may be achieved. These example ranges provide the following extremes, in which X and Y are the nominal x-direction magnification and nominal y-direction magnification of the optical system 100 (e.g., with zero magnification compensation in the x- and y-directions):

Extreme 1: Maximum Symmetric Magnification Compensation+Maximum Asymmetric Magnification Compensation X+250 ppm, Y+300 ppm Extreme 2: Maximum Symmetric Magnification Compensation+Minimum Asymmetric Magnification Compensation X+250 ppm, Y+200 ppm Extreme 3: Minimum Symmetric Magnification Compensation+Maximum Asymmetric Magnification Compensation X−250 ppm, Y−200 ppm Extreme 4: Minimum Symmetric Magnification Compensation+Minimum Asymmetric Magnification Compensation X−250 ppm, Y−300 ppm In some cases, small modifications to the optical and mechanical design may be utilized to adjust the amount of symmetric magnification and/or asymmetric magnification without changing the primary design of an optical system. For example, small modifications to the optical and mechanical design may be utilized to increase or decrease the amount of symmetric and asymmetric magnification without change to the primary design. Such small modifications may include adjusting the radii of the magnification compensation lenses and increasing or decreasing a travel of the lenses. In some cases, orders of two to three times those of the designed magnification can be achieved.

Although FIGS. 1 through 4 are described with reference to two sets of lenses with three lenses each, each set of lenses may have fewer, more, and/or different lenses than those shown in FIGS. 1 through 4. In addition, whereas FIGS. 1 through 4 provide example embodiments in which one set of lenses may be configured to (e.g., designed to) provide symmetric magnification and another set of lenses may be configured to provide asymmetric magnification, more and/or different sets of lenses may be utilized in other embodiments to provide symmetric and/or asymmetric magnification. As one example, in another embodiment, an optical system can include two asymmetric cylindrical lens assemblies. In some cases, such an optical system would ideally align the two lens sets orthogonal to one another, where one set of lenses along X for magnification of ±250 ppm in the x-direction and the second set of lenses along Y for magnification of ±250 ppm in the y-direction.

Figure 5:
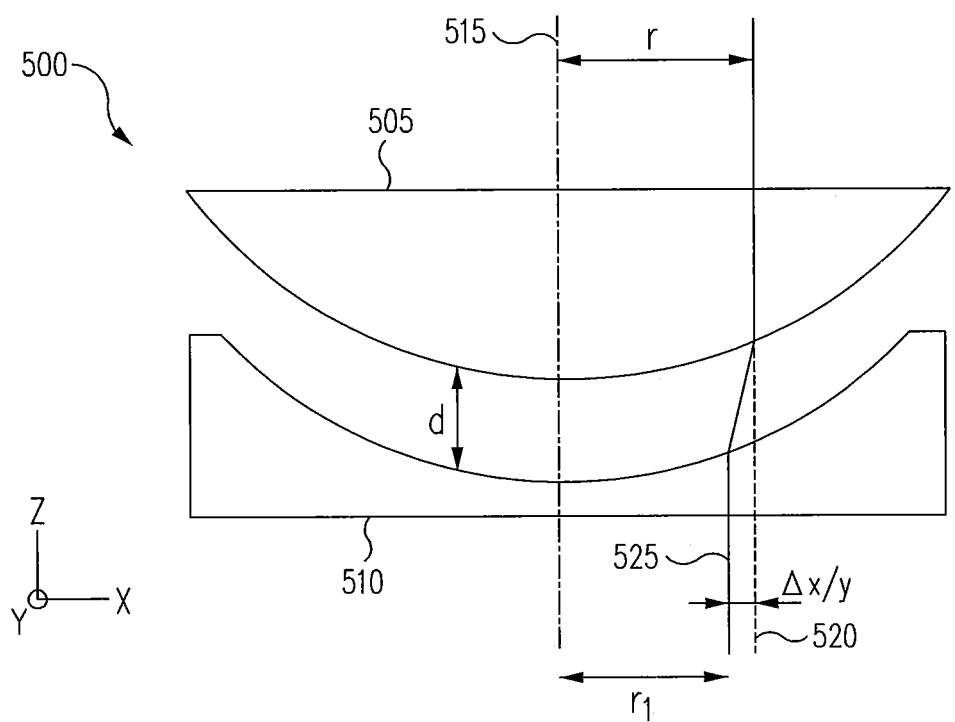
FIG. 5 illustrates a lens duo of an optical system in accordance with one or more embodiments of the present disclosure.

FIG. 5 illustrates a lens duo 500 of an optical system in accordance with one or more embodiments of the present disclosure. The lens duo 500 includes a lens 505 and a lens 510. The lenses 505 and 510 may be aligned such that the lenses 505 and 510 share an optical axis. The lenses 505 and 510 are separated (e.g., by air) by a distance d along the z-direction. In FIG. 5, the lens duo 500 forms a symmetric magnification lens set to provide rotational symmetric magnification compensation. As an example, the lenses 505 and 510 may be a plano-convex lens and a plano-concave lens, respectively. In an embodiment, the lens duo 500 may be used as the symmetric magnification lens set 125 shown in FIG. 1.

A dashed line 515 depicts an optical path for a beam passing through an optical axis of the lens duo 500 (e.g., an optical axis of the lenses 505 and 510). A dashed line 520 is parallel to and displaced by a distance r from an optical axis along the x-direction. A solid line 525 depicts an optical path for a beam entering through the lens 505 at a distance r from the line 515, converging toward the line 515 when passing through the air gap between the lenses 505 and 510, and passing through the lens 510 at a distance $r_1 = r - (\Delta x / \Delta y)$ from the optical axis. Since $r > r_1$, the lens duo 500 decreases magnification (e.g., provides a negative magnification compensation). To adjust the magnification compensation provided by the lens duo 500, one or both of the lens 505 or the lens 510 may be movable. For example, the lenses 505 and/or 510 may be moved by one or more actuators of an actuator system along the z-direction to adjust the distance d between the lenses 505 and 510.

In an aspect, with only one gap, the lens duo 500 of FIG. 5 generates negative or positive magnification compensation. This magnification compensation may be realized as defined previously for the case that $\varphi'_a \neq \varphi'_b$ (e.g., first lens power is not equal in magnitude to second lens power). Namely, in this case, when $$d = \frac{\varphi'_a + \varphi'_b}{d\varphi'_a \varphi'_b}, \varphi'_{ab} = 0.$$

When $$d > \frac{\varphi'_a + \varphi'_b}{d\varphi'_a \varphi'_b}, \varphi'_{ab} < 0.$$

When $$d < \frac{\varphi'_a + \varphi'_b}{d\varphi'_a \varphi'_b}, \varphi'_{ab} > 0.$$

When the lenses 505 and 510 have different radii, the magnification of the two lens group (denoted as $\varphi'_{ab}$) can be changed from positive to negative for varying values of the gap d between the lenses 505 and 510. In some cases, use of a lens duo may be less expensive and/or result in a simpler product than use of a lens trio or more than three lenses.

Although the lens duo 500 of FIG. 5 form a symmetric magnification lens set, an optical system may employ a lens duo for an asymmetric magnification lens set alternative to and/or in addition to employing the lens duo 500. In this regard, the number of lenses in the symmetric magnification lens set may be the same or may be different from the number of lenses in the asymmetric magnification lens set. The number of lenses used in an optical system may be based on considerations such as costs, manufacturing complexity, performance specifications, and/or other considerations. In some cases, a lens duo may be associated with lower monetary costs and manufacturing complexity (e.g., than a lens set with three or more lenses). In some cases, when the symmetric magnification lens set and asymmetric magnification lens set each include a lens duo, the mask may be undersized and/or oversized with asymmetry. For example, relative to a mask of a reference size, the mask may be undersized by different factors and/or oversized by different factors at different portions of the mask.

In an embodiment, the asymmetric magnification lens set may be used to provide asymmetric magnification compensation along only one direction (e.g., either x-axis or y-axis) and only one of positive magnification compensation or negative magnification compensation. For example, the asymmetric magnification lens set with two lenses may be used to correct one of the axes by anywhere between 0 to +50 ppm or 0 to −50 ppm as opposed to correcting one of the axes by anywhere between −50 ppm to +50 ppm for an asymmetric magnification lens set with three (or more) lenses. In some case, the use of two lenses may be easier to manufacture (e.g., each lens of the two lens system may be made thicker). In some cases, the lens duo may be rotatable to allow magnification compensation along one axis. For example, in one orientation of the lens duo, the lens duo may provide asymmetric magnification correction along only the x-axis. This lens duo may be rotated by 90° to provide magnification correction along only the y-direction.

Figure 6:
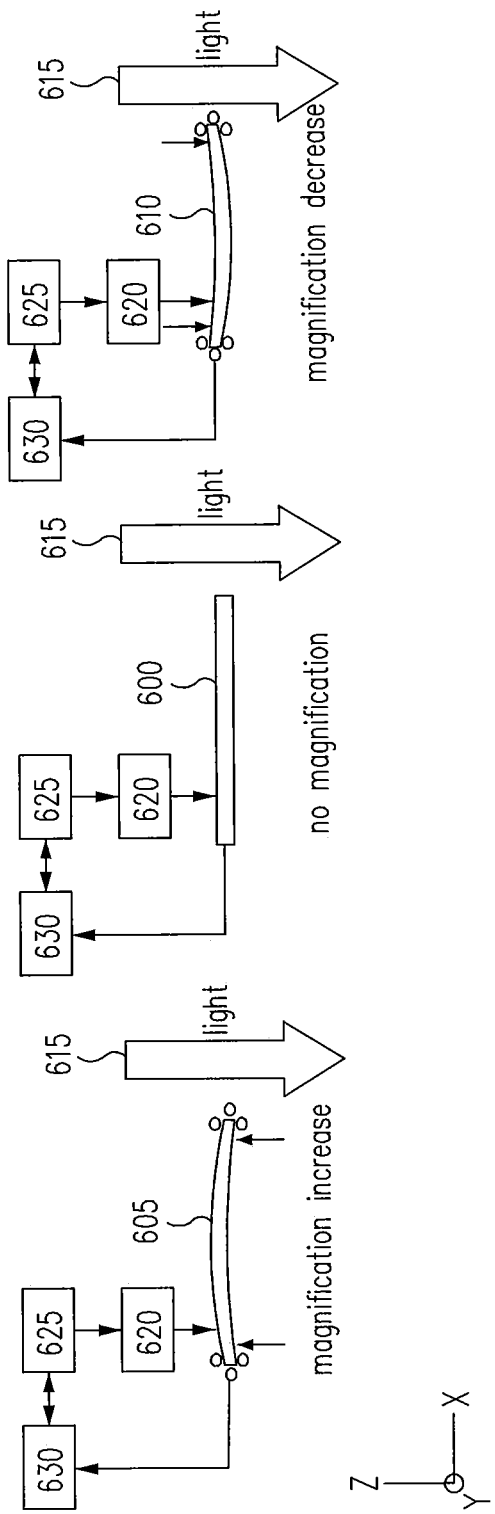
FIG. 6 illustrates an asymmetric magnification lens in accordance with one or more embodiments of the present disclosure.

In some embodiments, the lenses 130A, 130B, and 130C of the asymmetric magnification lens set 130 may be a plano-convex cylinder lens, concave-concave cylinder lens, and a convex-plano lens, with a thickest portion of the lenses 130A-C being around 2 mm to 10 mm. In an aspect, a single lens may be employed in place of the lenses 130A, 130B, and 130C. FIG. 6 illustrates an asymmetric magnification lens 600 in accordance with one or more embodiments of the present disclosure. In an embodiment, the asymmetric magnification lens set 130 may be the asymmetric magnification lens 600. In other embodiments, the asymmetric magnification lens set 130 may include the asymmetric magnification lens 600 along with one or more other lenses.

The asymmetric magnification lens 600 may be a plano window, such as shown in FIG. 6. An actuator may bend the asymmetric magnification lens 600 to cause the plano window to deform into a concave-convex lens that can generate magnification compensation (e.g., along its bent axis). Depending on the direction that the asymmetric magnification lens 600 is bent, the asymmetric magnification lens 600 can create positive or negative magnification compensation. In some cases, the asymmetric magnification lens 600 may be selectively bent (e.g., deformed) in the x-direction, y-direction, or both as needed to create a desired magnification compensation (e.g., an asymmetric magnification compensation) in one or both of the x- or y-directions.

In an aspect, an actuator system may be provided to control magnification provided by the asymmetric magnification lens 600. The actuator system may include an actuator 620, an actuator controller 625, and a feedback device 630. The actuator 620 may be configured to apply a force along a set direction on the asymmetric magnification lens 600 to provide magnification compensation in the x-direction, y-direction, or both in accordance with control signals provided by the actuator controller 625 to the actuator 620. The actuator controller 625 may receive information and generate these control signals for the actuator 620 based on the received information. The information may be indicative of a desired magnification to be provided by the asymmetric magnification lens 600. In some cases, the control signals generated by the actuator controller 625 may be indicative of a force (if any) to be applied on the asymmetric magnification lens 600 by the actuator 620 and a direction to apply the force. By applying the force on the asymmetric magnification lens 600, the actuator 620 may cause the asymmetric magnification lens 600 to provide a desired magnification. The feedback device 630 may be, may include, or may be a part of, an encoder; capacitive, inductive or laser sensor; strain gauge; and/or generally any device that can be used to verify a configuration (e.g., amount of bend, direction of bend, associated magnification) of the asymmetric magnification lens 600 before, during, and/or after application of the force by the actuator 620. In this regard, the actuator controller 625 and feedback device 630 may operate in tandem (e.g., exchange appropriate information) to help ensure the asymmetric magnification lens 600 is configured properly. In some cases, the actuator 620, or other actuator, may rotate the asymmetric magnification lens 600 alternative to or in addition to bending the asymmetric magnification lens 600 to effectuate desired magnification compensation in the x-direction, y-direction, or both.

For example, the asymmetric magnification lens 600 may be bent by the actuator 620 (e.g., based on appropriate control signals from the actuator controller 625) to provide a lens 605 that causes positive magnification compensation when light 615 travels in the opposite direction as the bending direction. As another example, the asymmetric lens 600 may be bent by the actuator 620 to provide a lens 610 that causes negative magnification compensation when light 615 travels in the same direction as the bending direction. When the asymmetric magnification lens 600 is not bent, no magnification compensation is provided by the asymmetric magnification lens 600. In an aspect, use of a single lens, such as the asymmetric magnification lens 600, may involve mechanical design and/or control complexity (e.g., associated with the bending) and may allow for easier manufacturing, smaller optical thickness, and occupy less space in an optical system. In some cases, alternatively and/or in addition, a single symmetric magnification lens that can be deformed to provide symmetric positive magnification compensation or symmetric negative magnification compensation can be utilized as the symmetric magnification lens set.

Figure 7:
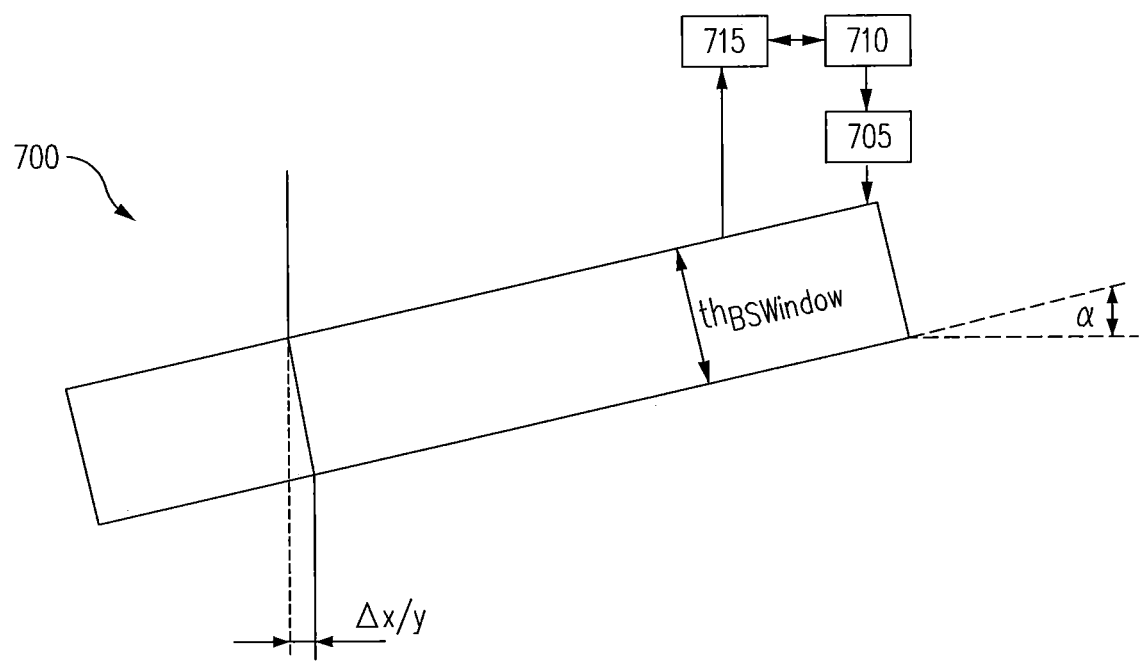
FIG. 7 illustrates a beam steering lens of an optical system in accordance with one or more embodiments of the present disclosure.

FIG. 7 illustrates the beam steering lens 135 of the optical system 100 in accordance with one or more embodiments of the present disclosure. The beam steering lens 135 may also be referred to as a tilting lens. The beam steering lens 135 may be tilted (e.g., by an actuator of an actuator system) as appropriate to redirect a beam of light to a desired location (e.g., on the image plane 110). For example, the beam steering lens 135 may be coupled to an actuator system that can control the tilt of the beam steering lens 135. The actuator system may include an actuator 705, an actuator controller 710, and a feedback device 715, which may be implemented in the same or similar manner as corresponding actuator systems of FIGS. 2A, 2B, and 6. The tilt may be represented by one or more angles. An angle α may provide an amount of tilt along an x-direction. Another angle (not shown) may provide an amount of tilt along a y-direction. In FIG. 7, the tilt of the beam steering lens 135 causes a displacement of a beam by a distance (Δx/Δy) relative to a case that the beam steering lens 135 is not tilted. As shown in FIG. 7, the displacement of the beam by the beam steering lens 135 is based on the tilt angle or angles of the beam steering lens 135 and dimensions of the beam steering lens 135 (e.g., a distance within the beam steering lens 135 through which a beam needs to propagate).

Figure 8:
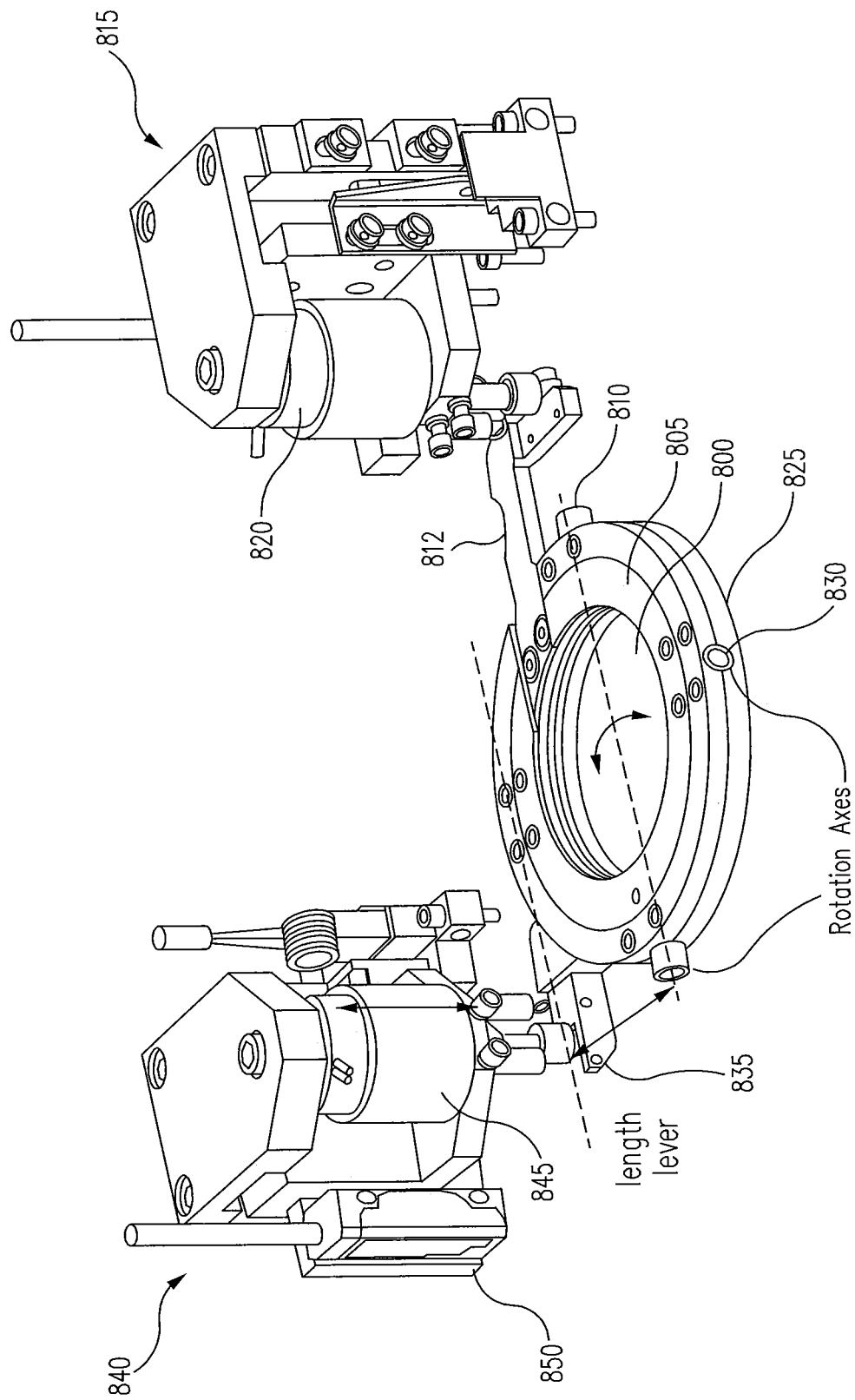
FIG. 8 illustrates a beam steering lens and associated components in accordance with one or more embodiments of the present disclosure.

FIG. 8 illustrates a beam steering lens 800 and associated components in accordance with one or more embodiments of the present disclosure. Not all of the depicted components may be required, however, and one or more embodiments may include additional components not shown in FIG. 8. Variations in the arrangement and type of the components may be made without departing from the spirit or scope of the claims as set forth herein. Additional, fewer, and/or different components may be provided. In an embodiment, the optical system 100 may be utilized to provide optical asymmetric magnification with beam steering. In an embodiment, the beam steering lens 800 may be the beam steering lens 135.

The beam steering lens 800 may be supported in annular housing 805 and 825. The annular housing 805 has a pivot shaft 810 that allows the beam steering lens 800 to rotate in a first direction (e.g., x-direction). A flexure member 812 is connected to the annular housing 805. A linear drive 815 includes a voice coil actuator 820, ball slide assembly (not shown), and linear encoder. The voice coil actuator 820 may be coupled to the flexure member 812 and may displace the flexure member 812 by a linear axis to cause rotation of the beam steering lens 800. The linear encoder of the linear drive 815 may provide feedback to the voice coil actuator 820 and/or the ball slide assembly to control displacement and/or rotation of the beam steering lens 800 effectuated by the linear drive 815.

The annular housing 825 of the beam steering lens 800 may facilitate tilting of the beam steering lens 800 in a second axis. For example, the second axis may be orthogonal to the first axis. The annular housing 825 is coupled to the annular housing 805. The annular housing 825 has a pivot shaft 830. The pivot shaft 830 is attached to a flexure member 835 and a linear drive 840. The linear drive 840 includes a voice coil actuator 845, ball slide assembly (not shown), and linear encoder 850. The voice coil actuator 845 may be coupled to the flexure member 835 and may displace the flexure member 835 by a linear axis to cause rotation of the beam steering lens 800. The linear encoder 850 may provide feedback to the voice coil actuator 845 and/or the ball slide assembly of the linear drive 840 to control displacement and/or rotation of the beam steering lens 800 effectuated by the linear drive 840.

Although FIG. 8 illustrates an example of a beam steering lens and associated components (e.g., for mechanically displacing and/or rotating the beam steering lens), other beam steering lenses and/or associated components may be employed. For example, the voice coil actuators 820 and/or 845 may be replaced with or used in addition to mechanical or pneumatic linear actuators and/or piezo stepping actuators. As another example, the ball slide assemblies may be crossed roller slides. In some aspects, a beam steering lens may be tilted using a cam that is attached to a rotary motor. In some aspects, an axis of the beam steering lens may be driven directly using a rotary motor and/or a geared motor.

In some embodiments, a beam steering lens (e.g., 135, 700, 800) may be utilized with one or more lens sets described in the present disclosure, such as those shown in FIGS. 1-6. In some aspects, a beam steering lens may be utilized with one or more lens sets, such as one or more symmetric magnification lens sets (e.g., 125) and/or one or more asymmetric magnification lens sets (e.g., 130). For example, with reference to FIG. 1, the beam steering lens 135 may be utilized with the symmetric magnification lens set 125 (e.g., without the asymmetric magnification lens set 130), or the beam steering lens 135 may be utilized with the asymmetric magnification lens set 130 (e.g., without the symmetric magnification lens set 125).

Such modification to the optical system 100 of FIG. 1 to remove one of the magnification lens sets 125 or 130 may be associated with appropriate adjustment (e.g., positioning) of one or more associated components, such as the prisms 140 and 145 and the lens 160, 165, 170, and 175, or no adjustment of any of these components. As an example, consider the asymmetric magnification lens set 130 is removed from the optical system 100. In one case, as previously described, the symmetric magnification lens set 125; prisms 140 and 145; lenses 160, 165, 170, and 175; and mirror 155 may remain as shown in FIG. 1. An output beam from the prism 145 may be provided (e.g., as the beam 120) to the beam steering lens 135 and directed onto the image plane 110. In another case, the symmetric magnification lens set 125 may be positioned where the asymmetric magnification lens set 130 is shown in FIG. 1, while the prisms 140 and 145; lenses 160, 165, 170, and 175; and mirror 155 may remain as shown in FIG. 1. An output beam from the symmetric magnification lens set 125 may be provided to the beam steering lens 135 and directed onto the image plane 110. In yet another case, the symmetric magnification lens set 125 may be positioned elsewhere, such as between the prisms 140 and 145. Other manners by which to provide the symmetric magnification lens set 125 and not the asymmetric magnification lens set 130 may be utilized.

Figure 9:
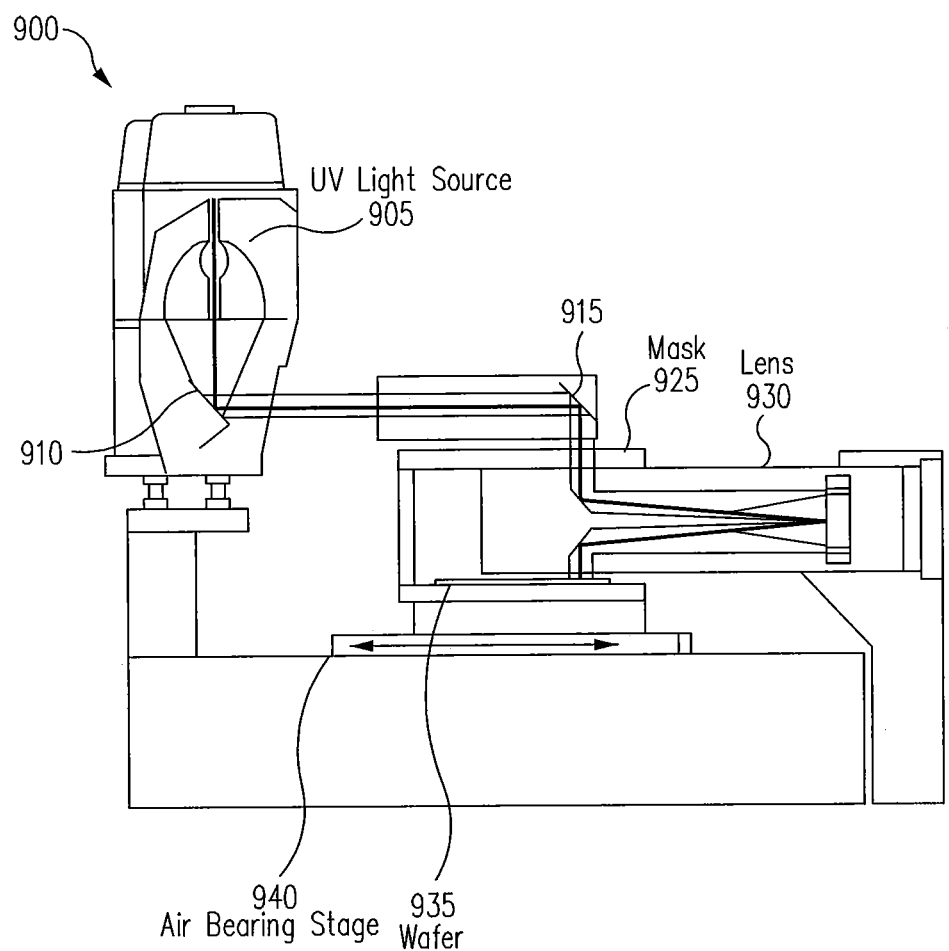
FIG. 9 illustrates a lithography system in accordance with one or more embodiments of the present disclosure.

In one or more embodiments, the optical system may be, may include, or may be a part of a projection lens system, used in a lithography system. FIG. 9 illustrates a lithography system 900 in accordance with one or more embodiments of the present disclosure. Not all of the depicted components may be required, however, and one or more embodiments may include additional components not shown in FIG. 9. Variations in the arrangement and type of the components may be made without departing from the spirit or scope of the claims as set forth herein. Additional, fewer, and/or different components may be provided. In an embodiment, the optical system 100 may be utilized to provide optical asymmetric magnification with beam steering.

The lithography system 900 includes a radiation source 905, mirrors 910 and 915, a mask 925, an optical system 930, a wafer 935, and an air bearing stage 940. In FIG. 9, the mirrors 910 and 915 are optical components utilized to direct the radiation (e.g., UV light) from the radiation source 905 to the mask 925. Fewer, more, and/or different optical components may be provided between the radiation source 905 and the mask 925. For example, additional optical components, such as optical waveguides, lenses, and mirrors, may be between the mirrors 910 and 915. In some cases, the mirrors 910 and 915 and/or other optical components may adjust beam characteristics of the radiation from the radiation source 905, such as optical distance (e.g., distances traveled by radiation from the radiation source 905 to reach the mask 925), beam shape, beam size, beam polarization, etc. The mask 925 may be disposed at an object plane of the lithography system 900, and the wafer 935 may be disposed at an image plane 110 of the lithography system 900, with the lithography system 900 being utilized to project a pattern on the mask 925 onto the wafer 935 using the optical system 930. In this regard, the optical system 930 may provide symmetric and/or asymmetric magnification. In an embodiment, the optical system 930 may be, may include, or may be a part of, the optical system 100 of FIG. 1. In this embodiment, the mask 925 is disposed at the object plane 105 and the wafer 935 is disposed at the image plane 110.

Figure 10:
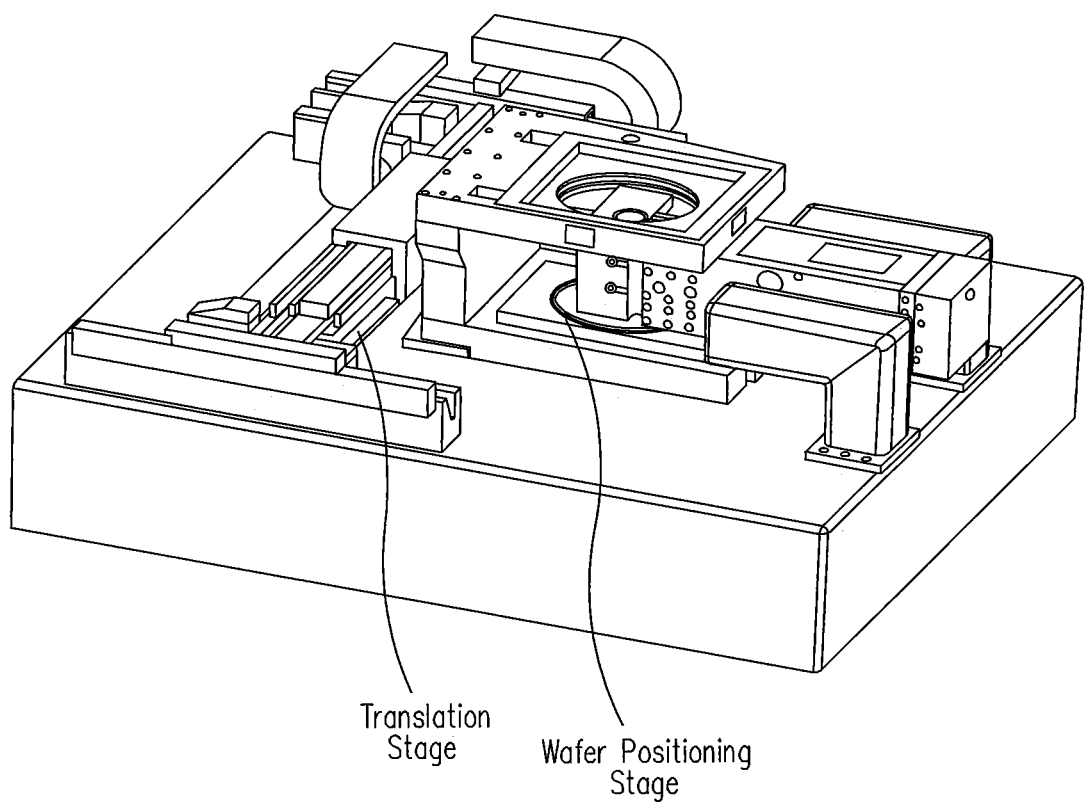
FIG. 10 illustrates a scanning lithography machine or portion thereof in accordance with one or more embodiments of the present disclosure.

In some embodiments, the lithography system 900 may be, may include, or may be a part of, a scanning lithography machine. For example, FIG. 10 illustrates a scanning lithography machine or portion thereof in accordance with one or more embodiments of the present disclosure. In this embodiment, the wafer 935 and mask 925 may both be mounted to a carriage that is scanned under the optical system 930 at a translation stage. The wafer 935 and mask 925 may be aligned to one another before the scanning process. The alignment process may involve translating and/or rotating the wafer 935 relative to the mask 925, and may be performed with a wafer positioning stage.

Figure 11A:
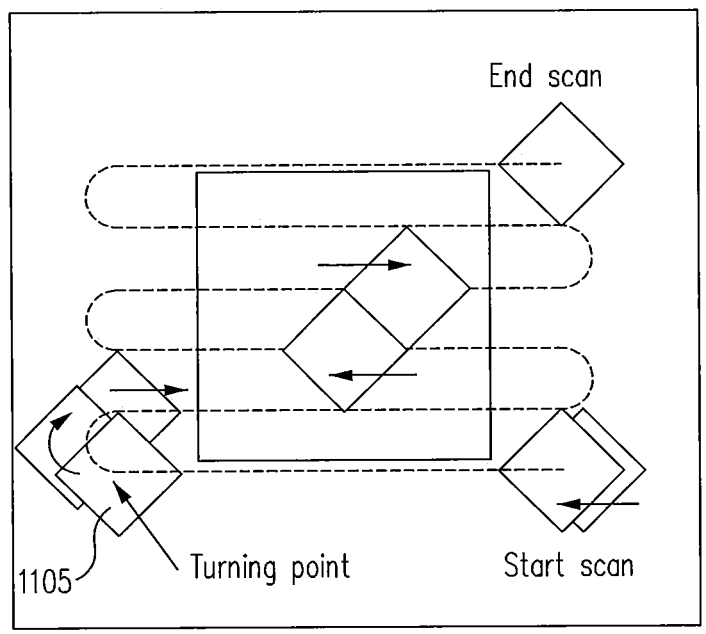
FIGS. 11A and 11B illustrate examples of exposure fields for a scanning lithography machine.
Figure 11B:
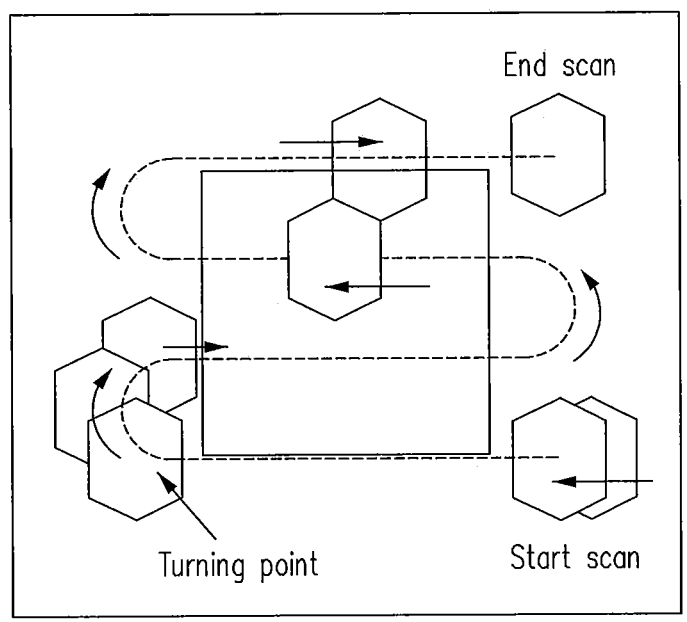

FIGS. 11A and 11B illustrate examples of exposure fields for a scanning lithography machine. An exposure field represents a FOV of a scanner of the lithography system 900. The exposure field moves across the wafer 935 along an x-direction and displaces along a y-direction and reverses the x-direction after reaching a turning point, as shown in FIGS. 11A and 11B. In some cases, scans that are adjacent in time may overlap to help produce a uniform exposure across the wafer 935. In FIG. 11A, the exposure field (e.g., 1105) has a diamond shape. In FIG. 11B, the exposure field has a hexagon shape. In some cases, use of a hexagon exposure field may decrease time needed to scan the wafer 935 by increasing a step distance in between scan passes. In this regard, the hexagon shape allows for a decreased overlapped area, which allows for a reduced number of scan passes a higher machine throughput. Although the following description is provided with respect to a diamond shaped exposure field, other exposure field shapes, such as the hexagon shape, rectangular shape, etc. may be utilized.

Figure 12:
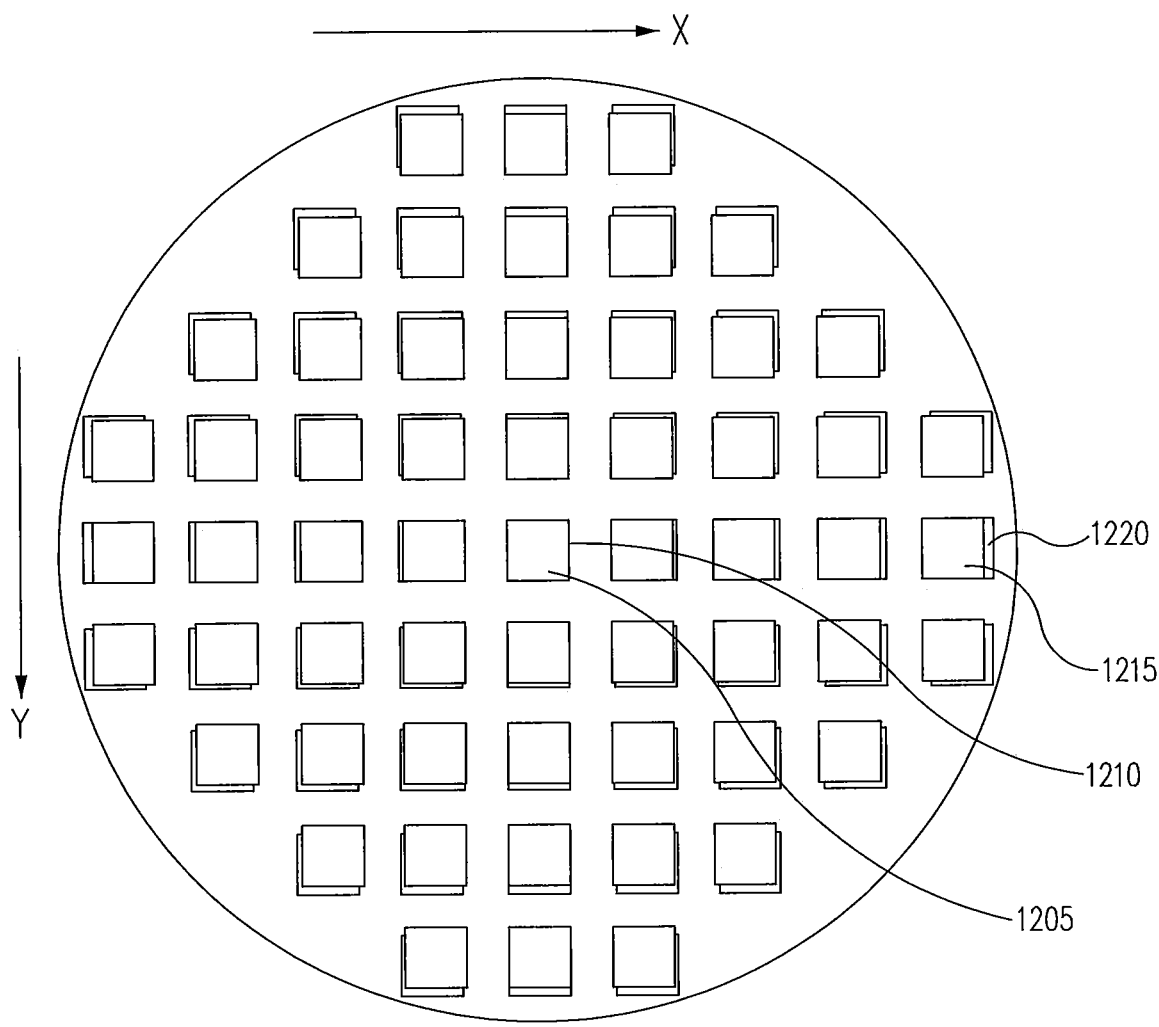
FIG. 12 illustrates actual and desired die size and location for various die on a wafer.

In some embodiments, a size of the exposure field (e.g., diamond shaped, hexagon shaped, etc.) may need to be adjusted during the scan across the wafer 935, and/or a location at which the exposure field impinges on the wafer 935 may need to be steered. FIG. 12 illustrates actual and desired die size and location for various die on the wafer 935. In FIG. 12, the same magnification is associated with each portion of the wafer 935 and the same (or no) beam steering is associated with the wafer 935. The actual die size and location overlay the desired die size and location. A die 1205 (e.g., a center die of the wafer 935) is an actual die size and location, whereas a die 1210 is its corresponding desired die size and location for the die 1205. Similarly, a die 1215 is an actual die size and location, whereas a die 1220 is its corresponding desired die size and location for the die 1215.

Figure 13A:
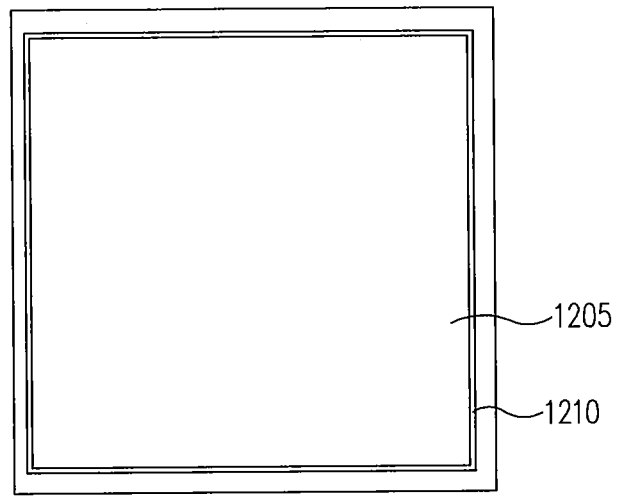
FIGS. 13A and 13B provide enlarged views of die of FIG. 12.
Figure 13B:
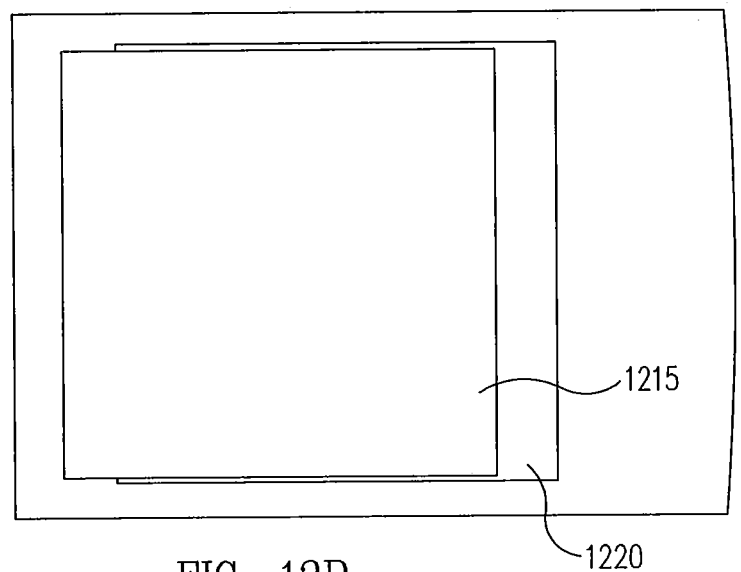

FIG. 13A provides an enlarged view of the die 1205 and die 1210 of FIG. 12. To obtain the die 1210, the die 1205 may remain at the same location, but with positive magnification compensation applied to provide a larger projection on the wafer 935. FIG. 13B provides an enlarged view of the die 1215 and die 1220 of FIG. 12. To obtain the die 1220, positive magnification compensation and a shift of an image may be applied. With reference to FIG. 1, the positive magnification compensation may be provided by the symmetric lens set 125 and/or the asymmetric lens set 130, and the shift may be applied by the beam steering lens 135.

Figure 14A:
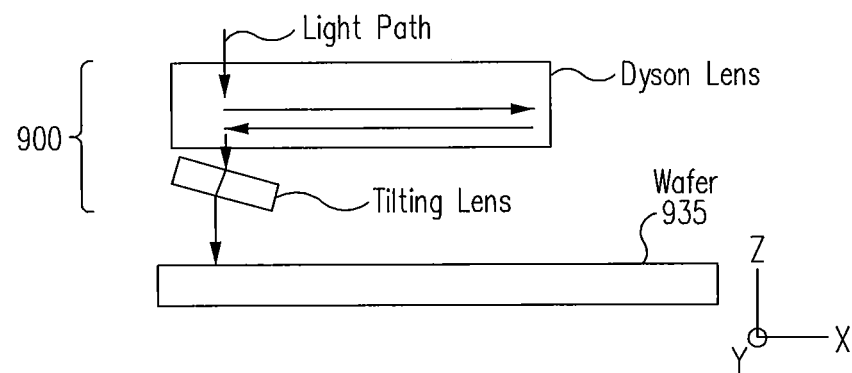
FIGS. 14A through 14C illustrate tilting of a beam steering lens of an optical system as a wafer is moved, in accordance with one or more embodiments of the present disclosure.
Figure 14B:
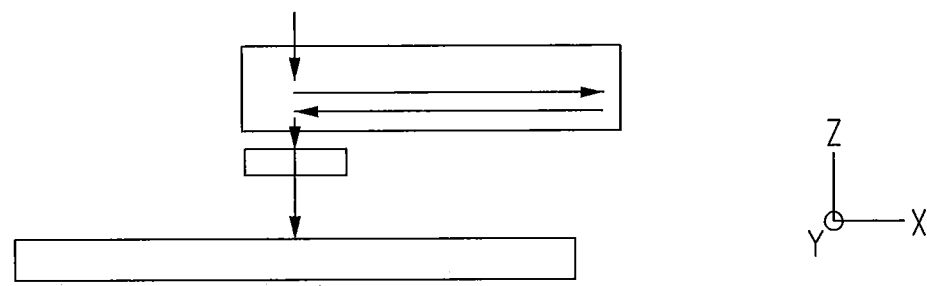
Figure 14C:
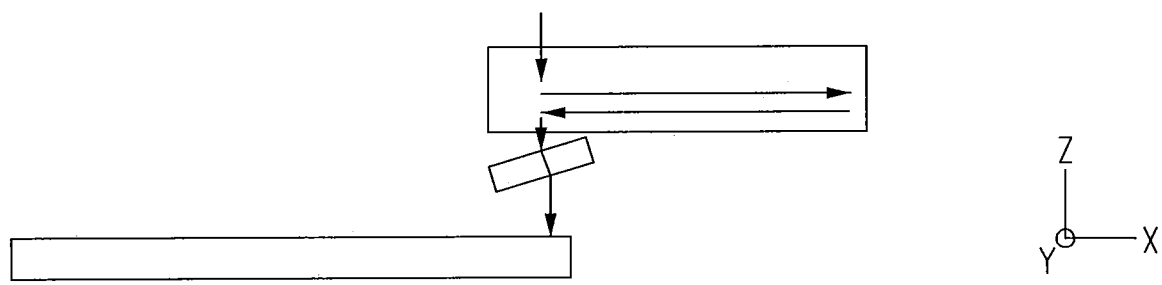

In some cases, such magnification compensation and/or image steering may be adjusted as the wafer 935 is translated back and forth under the exposure field. As previously indicated, one or more beam steering lenses may be utilized to steer a location of an image that is formed at an image plane (e.g., at the wafer 935). Such a technique may be referred to as optical beam steering. With regard to lithography applications, the optical beam steering may be utilized to tilt a projected image of the mask 925 using a beam steering lens in coordination with wafer position. FIGS. 14A through 14C illustrate tilting of a beam steering lens of an optical system 900 as the wafer 935 is moved, in accordance with one or more embodiments of the present disclosure. With reference to FIGS. 12 and 14A through 14C, as the wafer 935 scans from left to right, the beam may be tilted to project the image further toward the left extremity of the wafer 935. As the wafer 935 is scanned to the right from its position at FIG. 14A, a tilt provided by the beam steering lens may be continually adjusted in synchronization with the motion of the wafer 935 and mask 925 (e.g., which are locked together in a scanner system). When the wafer 935 is directly under the beam steering lens (e.g., at the center die) as shown in FIG. 14B, the beam steering lens may provide zero tilt. As the wafer 935 continues to the right as shown in FIG. 14C, the beam steering lens is tilted to project the image to the right extremity of the wafer 935. With reference back to FIG. 7, the beam steering lens may allow tilting along one or both of the x- and y-axis. For instance, if the scan occurs along the x-direction, an x-axis tilting of the beam steering lens is performed in synchronization with the wafer scanning motion along the x-direction. A y-axis tilting may be performed during the step between rows of the scan.

In some embodiments, alternatively and/or in addition to beam steering using one or more beam steering lenses, micro wafer positioning may be utilized. In micro wafer positioning, the position of the wafer relative to the mask may be minutely adjusted as the wafer 935 is scanned across an optical system (e.g., with or without a beam steering lens). While the wafer positioning stage maintains the relative positioning of the mask 925 to the wafer 935 during the scanning exposure, the position of the wafer 935 may be driven in an axis of scanning while the translation stage is performing its scan path. As the wafer 935 is scanned in the +x-direction (e.g., to the right), the micro wafer positioning may shift the wafer 935 relative to the mask 925 in a coordinated manner with the translation stage. In this manner, the wafer 935 is continually moved relative to the mask 925 during a scan row. When the translation stage steps to a next row, the translation stage may perform a micro step to shift the wafer 935 relative to the mask 925 to adjust for an offset in the y-direction. In some cases, micro wafer positioning may be performed by a wafer positioning controller that can adjust the position of the wafer relative to the position of the mask in order to shift a position on the wafer 935 at which an image is formed on the wafer 935 by having moved the wafer 935. It should be noted that, although the foregoing description of the present disclosure refers to the x-axis and y-axis as the scan axis and step axis, respectively, it is understood that the conventions could also be that the x-axis is the step axis and the y-axis is the scan axis.

With reference back to FIG. 10, the wafer positioning stage can have accurate and stiff fine positioning actuators that can be used to effect the micro wafer positioning described above. In some cases, mechanical piezo actuators with strain gauge feedback acting upon a mechanical flexure system can be used to adjust the wafer position relative to the mask while the translation stage is in motion scanning and stepping the wafer under the lens FOV.

Figure 15A:
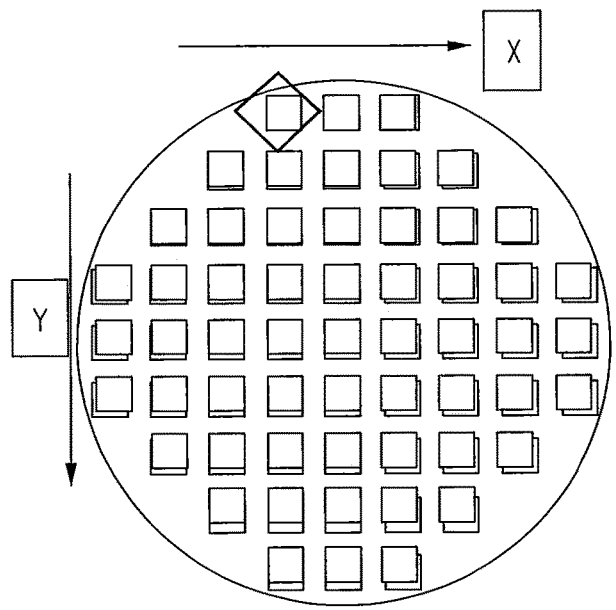
FIGS. 15A through 15D illustrate a position of a seamier exposure field of view and associated wafer position shifting in accordance with one or more embodiments of the present disclosure.
Figure 15B:
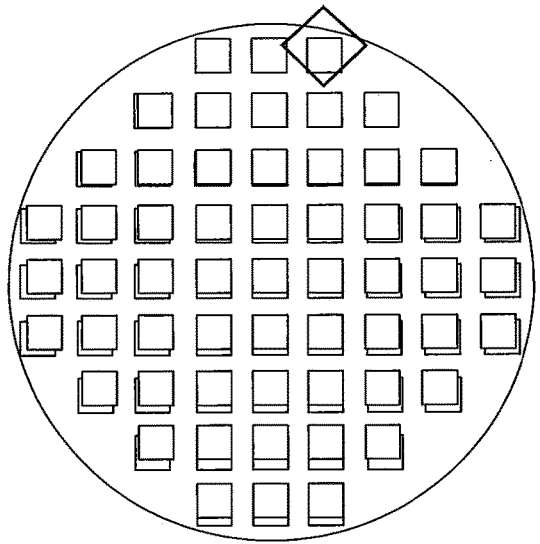
Figure 15C:
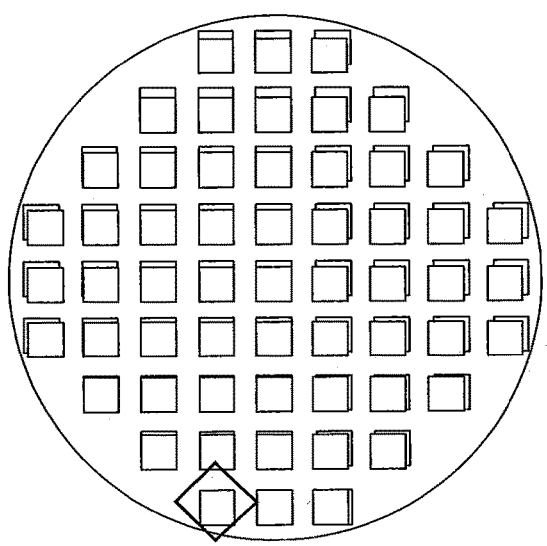
Figure 15D:
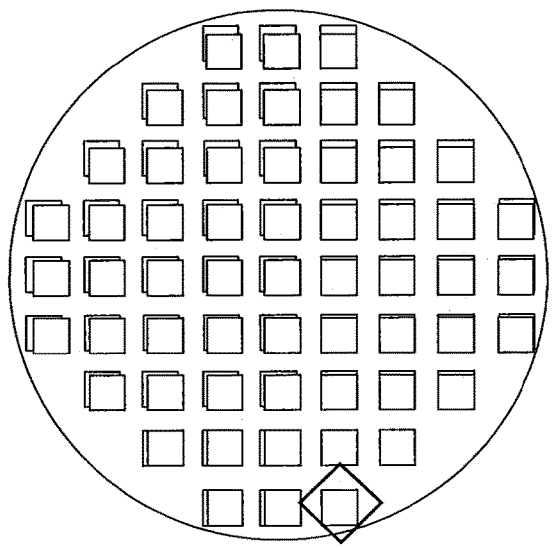

For example, FIGS. 15A through 15D illustrate a position of a scanner exposure FOV and associated wafer position shifting in accordance with one or more embodiments of the present disclosure. FIG. 15A illustrates micro wafer positioning at scan start, with the wafer 935 being shifted in −x-direction (e.g., left) and −y-direction (e.g., down). FIG. 15B illustrates micro wafer positioning at scan end, with the wafer 935 being shifted in +x-direction (e.g., right). FIG. 15C illustrates micro wafer positioning at scan start, with the wafer 935 being shift in −x-direction and +y-direction. FIG. 15D illustrates micro wafer positioning at scan end, with the wafer 935 shifted in +x-direction.

In an embodiment, an actuator controller (e.g., 215 in FIG. 2) may receive information associated with a relative positioning of the mask 925 and the wafer 935. In a lithography system, images of the mask 925 and wafer 935 may be captured by camera systems to determine an expected projection of the mask 925 (e.g., pattern of the mask 925) onto the wafer 935. The expected projection may be used to determine magnification compensation, beam steering, and/or micro wafer positioning needed to adjust from the expected projection to a desired projection. The actuator controller may generate control signals associated with the magnification compensation, beam steering, and/or micro wafer positioning and provide these control signals to relevant components to effectuate the magnification compensation (e.g., actuators 205 and 210 of the lens sets 125 and 130), beam steering (e.g., actuator of the beam steering lens 135), and/or micro wafer positioning. FIGS. 14A-14C and FIGS. 15A-15D depict the effectuation of the magnification compensation, beam steering, and/or micro wafer positioning.

In an embodiment, as an example, the wafer 935 may be moved (e.g., using an actuator system) at a constant velocity relative to the mask 925 in an alternating fashion for each scan pass. For example, with reference to FIGS. 2A and 9, to achieve a target magnification of 200 ppm, the actuator 205 may move the symmetric magnification lens set 125 to a position associated with providing a magnification of 200 ppm and then the wafer 935 would scan relative to the mask 925 on each scan pass an amount equal to 200 ppm across the wafer 935. For smaller magnification amounts, the shift may generally be smaller. An associated velocity may be defined by a shift amount (e.g., based on magnification amount) divided by a time to complete the scan pass. In this regard, a smaller target magnification (e.g., 50 ppm) may utilize a smaller shift and thus have a smaller velocity, relative to a larger target magnification (e.g., 200 ppm) that has a larger shift and thus a higher velocity. For a given magnification, the velocity is constant.

In an embodiment, an additional use of beam steering and/or micro wafer positioning can be to compensate for small translation or rotational differences between the mask and wafer that are identified during the alignment routine. For example, if the wafer is translated relative to the mask, the wafer can be repositioned to be directly under the mask, or the beam steering can be utilized to compensate for the offset. This can be applied to rotational differences as well. It can also be applied in cases where there is a different correction required in the x-direction and the y-direction for the alignment.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

The foregoing description is not intended to limit the present disclosure to the precise forms or particular fields of use disclosed. Embodiments described above illustrate but do not limit the invention. It is contemplated that various alternate embodiments and/or modifications to the present invention, whether explicitly described or implied herein, are possible in light of the disclosure. Accordingly, the scope of the invention is defined only by the following claims.

The invention claimed is:

1. An optical system comprising:
   a lens system configured to receive first radiation associated with an object and direct second radiation associated with an image of the object toward an image plane, wherein the object comprises a pattern of a mask, the image plane is disposed on a wafer, and the image comprises a projection of the object on the wafer, the lens system comprising:
a first set of lenses configured to receive and selectively magnify the first radiation;
an actuator system configured to:
selectively adjust the first set of lenses to adjust a magnification associated with the image symmetrically along a first direction and a second direction; and
in response to one or more control signals, adjust a tilt of a beam steering lens as the wafer is scanned; and
the beam steering lens configured to direct, based at least on the tilt of the beam steering lens, the first radiation selectively magnified by the first set of lenses to provide the second radiation.

2. The optical system of claim 1, further comprising:
a lens assembly comprising a plurality of lenses;
a first prism configured to pass the first radiation to the lens assembly, wherein the first set of lenses is configured to pass the first radiation to the first prism;
a mirror configured to receive the first radiation from the first prism via the plurality of lenses of the lens assembly and reflect the first radiation; and
a second prism configured to receive the first radiation reflected from the mirror via the plurality of lenses of the lens assembly and direct the first radiation on an optical path toward the beam steering lens and the image plane.

3. The optical system of claim 1, further comprising a second set of lenses configured to receive and selectively magnify the first radiation, wherein the actuator system is further configured to selectively adjust the second set of lenses to adjust the magnification along the first direction or the second direction, and wherein the beam steering lens is configured to direct, based at least on the tilt of the beam steering lens, the first radiation selectively magnified by the first set of lenses and second set of lenses to provide the second radiation.

4. The optical system of claim 3, further comprising:
a lens assembly comprising a plurality of lenses;
a first prism configured to pass the first radiation to the lens assembly;
a mirror configured to receive the first radiation from the first prism via the plurality of lenses of the lens assembly and reflect the first radiation; and
a second prism configured to receive, directly from the plurality of lenses of the lens assembly, the first radiation reflected from the mirror via the plurality of lenses of the lens assembly and direct the first radiation on an optical path toward the image plane,
wherein the first set of lenses is configured to pass the first radiation to the first prism, and wherein the second prism is configured to pass the first radiation to the second set of lenses.

5. The optical system of claim 3, wherein:
the actuator system is configured to adjust the second set of lenses to apply a first magnification compensation value along the first direction to the magnification and to apply a second magnification compensation value along the second direction to the magnification,
the first magnification compensation value is different from the second magnification compensation value, and
the first direction is orthogonal to the second direction.

6. The optical system of claim 3, wherein the actuator system is configured to move at least one lens of the first set of lenses from a first position to a second position and/or at least one lens of the second set of lenses from a third position to a fourth position to adjust the magnification.

7. The optical system of claim 3, wherein the second set of lenses comprises a single lens, and wherein the actuator system is configured to bend and/or rotate the single lens to adjust the magnification.

8. The optical system of claim 1, wherein:
the optical system is a lithography system;
the optical system further comprises a magnification controller configured to generate the one or more control signals, wherein the one or more control signals are associated with an adjustment of the tilt of the beam steering lens and associated with an adjustment to the magnification based at least on a position of the mask relative to a position of the wafer; and
the actuator system is configured to receive the one or more control signals and cause adjustment of the magnification in response to the one or more control signals.

9. The optical system of claim 8, further comprising a wafer positioning controller configured to adjust the position of the wafer relative to the position of the mask to shift a position of the image on the wafer.

10. The optical system of claim 8, wherein:
the lens system is configured to project a respective portion of the pattern onto a respective portion of the wafer,
the actuator system is configured to, in response to the one or more control signals, adjust the tilt of the beam steering lens further in coordination with movement of the wafer, and
each portion of the wafer is associated with a respective tilt of the beam steering lens.

11. A method comprising:
receiving first radiation associated with an object, wherein the object comprises a pattern of a mask;
directing the first radiation through at least a first set of lenses to obtain selectively magnified first radiation, wherein, during the directing the first radiation, selectively adjusting the first set of lenses to adjust a magnification associated with an image of the object symmetrically along a first direction and a second direction, wherein the image comprises a projection of the object on a wafer, and wherein an image plane is disposed on the wafer; and
directing the selectively magnified first radiation to provide second radiation toward the image plane by adjusting a tilt of a beam steering lens as the wafer is scanned.

12. The method of claim 11, wherein the directing the first radiation comprises directing the first radiation through at least the first set of lenses and a second set of lenses to obtain the selectively magnified first radiation, wherein, during the directing the first radiation, selectively adjusting the second set of lenses to adjust the magnification along the first direction or the second direction.

13. The method of claim 12, wherein the selectively adjusting the second set of lenses comprises selectively adjusting the second set of lenses to apply a first magnification compensation value along the first direction to the magnification and to apply a second magnification compensation value different from the first magnification compensation value along the second direction to the magnification.

14. The method of claim 11, wherein the first set of lenses comprises a plurality of lenses, and wherein selectively adjusting the first set of lenses comprises adjusting a distance between at least two of the plurality of lenses.

15. The method of claim 11, wherein:
the directing the selectively magnified first radiation comprises projecting each portion of the pattern onto a respective portion of the wafer.

16. The method of claim 15, further comprising:
generating one or more control signals associated with an adjustment to the magnification based at least on a position of the mask relative to a position of the wafer, wherein the selectively adjusting the first set of lenses is based on the one or more control signals,
wherein the adjusting is in response to the one or more control signals,
wherein each portion of the wafer is associated with a respective tilt of the beam steering lens.

17. A method comprising:
receiving radiation associated with an object;
directing the radiation toward an image plane through at least a first set of lenses and a second set of lenses, wherein during the directing:
selectively adjusting the first set of lenses to adjust a magnification associated with an image of the object symmetrically along a first direction and a second direction; and
selectively adjusting the second set of lenses to adjust the magnification along the first direction or second direction.

18. The method of claim 17, wherein:
the object comprises a pattern of a mask,
the image plane comprises a wafer,
the image comprises a projection of the object on the wafer, and
the directing the radiation comprises projecting each portion of the pattern onto a respective portion of the wafer.

19. The method of claim 18, further comprising:
generating one or more control signals based at least on a position of the mask relative to a position of the wafer; and
adjusting a tilt of a beam steering lens in response to the one or more control signals, wherein each portion of the wafer is associated with a respective tilt of the beam steering lens.

20. An optical system comprising:
a lens system configured to receive first radiation associated with an object and direct second radiation associated with an image of the object toward an image plane, the lens system comprising:
a first set of lenses configured to receive and selectively magnify the first radiation;
a second set of lenses configured to receive and selectively magnify the first radiation; and
an actuator system configured to:
selectively adjust the first set of lenses to adjust a magnification associated with the image symmetrically along a first direction and a second direction; and
selectively adjust the second set of lenses to adjust the magnification along the first direction or the second direction.

21. The optical system of claim 20, wherein the lens system further comprises a beam steering lens configured to direct the first radiation based at least on a tilt of the beam steering lens to provide the second radiation, and wherein the tilt of the beam steering lens is adjustable by the actuator system.

22. The optical system of claim 20, further comprising:
a lens assembly comprising a plurality of lenses;
a first prism configured to pass the first radiation to the lens assembly;
a mirror configured to receive the first radiation from the first prism via the plurality of lenses of the lens assembly and reflect the first radiation; and
a second prism configured to receive the first radiation reflected from the mirror via the plurality of lenses of the lens assembly and direct the first radiation on an optical path toward the image plane.

23. The optical system of claim 22, wherein the first set of lenses is configured to pass the first radiation to the first prism, and wherein the second prism is configured to pass the first radiation to the second set of lenses.

24. The optical system of claim 20, wherein:
the actuator system is configured to adjust the second set of lenses to apply a first magnification compensation value along the first direction to the magnification and to apply a second magnification compensation value along the second direction to the magnification,
the first magnification compensation value is different from the second magnification compensation value, and
the first direction is orthogonal to the second direction.

25. The optical system of claim 20, wherein the actuator system is configured to move at least one lens of the first set of lenses from a first position to a second position and/or at least one lens of the second set of lenses from a third position to a fourth position to adjust the magnification.

26. The optical system of claim 20, wherein:
the optical system is a lithography system;
the object comprises a pattern of a mask;
the image plane comprises a wafer; and
the image comprises a projection of the object on the wafer.

27. The optical system of claim 26, further comprising:
a beam steering lens configured to provide the second radiation based at least on a tilt of the beam steering lens,
wherein:
the lens system is configured to project a respective portion of the pattern onto a respective portion of the wafer,
the actuator system is further configured to adjust a tilt of the beam steering lens in response to one or more control signals, and
each portion of the wafer is associated with a respective tilt of the beam steering lens.

* * * * *